(12) United States Patent
Liao et al.

(10) Patent No.: US 12,588,243 B2
(45) Date of Patent: Mar. 24, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chih-Teng Liao, Hsinchu (TW); Yi-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 920 days.

(21) Appl. No.: 17/739,149

(22) Filed: May 8, 2022

(65) Prior Publication Data

US 2023/0361184 A1     Nov. 9, 2023

(51) Int. Cl.
| | |
|---|---|
| *H10D 30/67* | (2025.01) |
| *H01L 21/02* | (2006.01) |
| *H01L 21/78* | (2006.01) |
| *H10D 30/01* | (2025.01) |
| *H10D 62/10* | (2025.01) |
| *H10D 84/01* | (2025.01) |
| *H10D 84/03* | (2025.01) |
| *H10D 84/85* | (2025.01) |

(52) U.S. Cl.
CPC ..... *H10D 30/6729* (2025.01); *H01L 21/0259* (2013.01); *H01L 21/7806* (2013.01); *H10D 30/031* (2025.01); *H10D 30/6713* (2025.01); *H10D 30/6735* (2025.01); *H10D 30/6757* (2025.01); *H10D 62/118* (2025.01); *H10D 84/0167* (2025.01); *H10D 84/017* (2025.01); *H10D 84/0186* (2025.01); *H10D 84/038* (2025.01); *H10D 84/85* (2025.01)

(58) Field of Classification Search
CPC .......................... H10D 84/0186; H10D 88/00
See application file for complete search history.

(56) References Cited

U.S. PATENT DOCUMENTS

| | | | |
|---|---|---|---|
| 2013/0197815 A1* | 8/2013 | Gardner ................. | G06F 18/22 702/27 |
| 2019/0214469 A1* | 7/2019 | Paul ................... | H10D 30/6729 |
| 2021/0098306 A1* | 4/2021 | Smith ............... | H01L 21/28097 |
| 2022/0122892 A1* | 4/2022 | Smith ................... | H10D 84/85 |
| 2022/0344481 A1* | 10/2022 | Hong .................... | H10D 30/43 |
| 2022/0406908 A1* | 12/2022 | Reznicek ........... | H10D 30/6735 |

* cited by examiner

*Primary Examiner* — Alia Sabur
(74) *Attorney, Agent, or Firm* — NZ Carr Law Office

(57) ABSTRACT

A semiconductor device structure, along with methods of forming such, are described. The structure includes a first source/drain region, a second source/drain region adjacent the first source/drain region, an interlayer dielectric layer disposed between the first source/drain region and the second source/drain region, and a conductive feature disposed in the interlayer dielectric layer between the first source/drain region and the second source/drain region. The conductive feature includes a first portion and a second portion extending from the first portion, and an angle is formed between the first portion and the second portion. The angle is less than about 180 degrees. The conductive feature is electrically connected to the first source/drain region.

20 Claims, 22 Drawing Sheets

100

100

100

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In pursuit of higher device density, higher performance, and lower costs, challenges from both fabrication and design issues have resulted in the development of three-dimensional designs, such as a multi-gate field effect transistor (FET), including a nanostructure FET. As transistor dimensions are continually scaled down, further improvements of the nanostructure FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-16A are cross-sectional side views of various stages of manufacturing the semiconductor device structure taken along line A-A of FIG. 6, in accordance with some embodiments.

FIGS. 7B-16B are cross-sectional side views of various stages of manufacturing the semiconductor device structure taken along line B-B of FIG. 6, in accordance with some embodiments.

FIG. 17C-1 is an enlarged cross-sectional side view of a conductive feature, in accordance with some embodiments.

FIG. 17C-2 is a top view of the conductive feature of FIG. 17C-1, in accordance with some embodiments.

DETAILED DESCRIPTION

Figure 1:
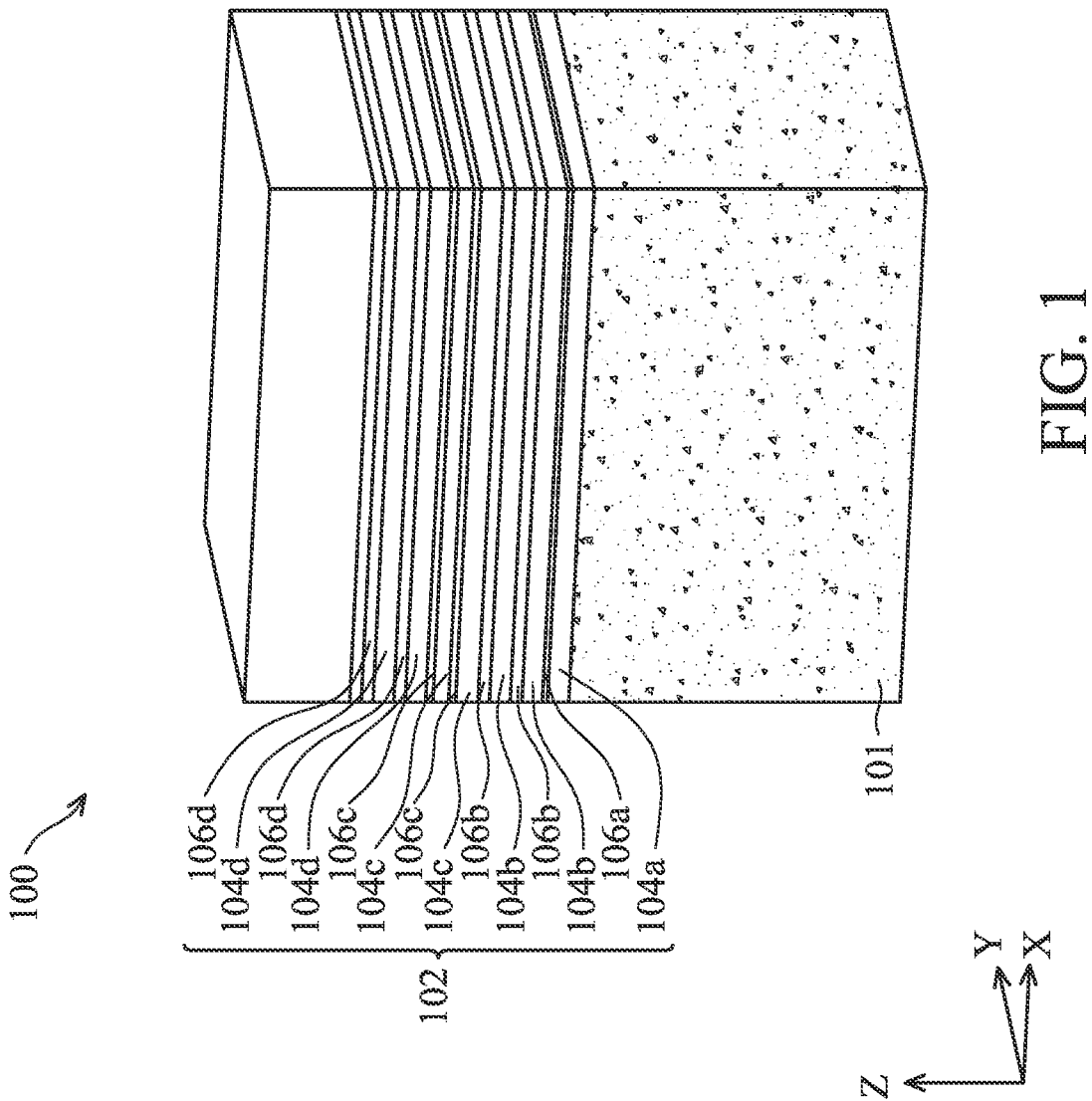
FIGS. 1-6 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-17I show exemplary sequential processes for manufacturing a semiconductor device structure 100, in accordance with some embodiments. It is understood that additional operations can be provided before, during, and after processes shown by FIGS. 1-17I and some of the operations described below can be replaced or eliminated, for additional embodiments of the method. The order of the operations/processes may be interchangeable.

FIGS. 1-12 are perspective views of various stages of manufacturing a semiconductor device structure 100, in accordance with some embodiments. As shown in FIG. 1, a stack of semiconductor layers 102 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include various regions that have been suitably doped with impurities (e.g., p-type or n-type impurities). The dopants are, for example boron for a p-type field effect transistor FET (NFET) and phosphorus for an n-type FET (PFET).

The stack of semiconductor layers 102 includes first semiconductor layers 104 (104a-104d) and second semiconductor layers 106 (106a-106d). The first semiconductor layers 104 and the second semiconductor layers 106 are made of semiconductor materials having different etch selectivity and/or oxidation rates. For example, the first semiconductor layers 104 are made of SiGe and the second semiconductor layers 106 are made of Si. In some embodiments, the stack of semiconductor layers 102 includes alternating first and second semiconductor layers 104, 106. The second semiconductor layers 106 or portions thereof may form nanosheet channel(s) of the semiconductor device structure 100 at a later stage. The semiconductor device structure 100 may include a nano structure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanostructure channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. The use of the second semiconductor layers 106 to define a channel or channels of the semiconductor device structure 100 is further discussed below.

In some embodiments, the semiconductor device structure 100 includes a complementary FET (CFET), and the second semiconductor layers 106 includes channels for two or more nanostructure FETs. For example, the second semiconductor layers 106*b* define the channels of a first FET, such as a PFET, and the second semiconductor layers 106*d* define the channels of a second FET, such as an NFET. The thickness of the second semiconductor layers 106*b*, 106*d* is chosen based on device performance considerations. In some embodiments, each second semiconductor layer 106*b*, 106*d* has a thickness ranging from about 7 nanometers (nm) to about 9 nm.

The second semiconductor layer 106*a* may function as an etch stop layer during back side processes. The second semiconductor layer 106*a* may have a thickness less than that of the second semiconductor layers 106*b* or 106*d*. In some embodiments, the thickness of the second semiconductor layer 106*a* ranges from about 1 nm to about 2 nm. The second semiconductor layers 106*c* may function as isolation layers that isolates the gate electrode layers and the dielectric material. The second semiconductor layer 106*c* may have a thickness less than that of the second semiconductor layers 106*b* or 106*d* and greater than that of the second semiconductor layer 106*a*. In some embodiments, the thickness of the second semiconductor layers 106*c* ranges from about 2 nm to about 4 nm. The use of the second semiconductor layers 106*a*, 106*b*, 106*c*, 106*d* to form isolated channels of two FETs is further discussed below.

The first semiconductor layers 104*b*, 104*d* may eventually be removed and serve to define spaces for a gate stack to be formed therein. The thickness is chosen based on device performance considerations. In some embodiments, each first semiconductor layer 104*b*, 104*d* has a thickness ranging from about 7 nm to about 11 nm. The first semiconductor layer 104*c* may eventually be removed and serve to define a space for a dielectric material to be formed therein. The thickness of the first semiconductor layer 104*c* may be less than that of the first semiconductor layers 104*b*, 104*d*. In some embodiments, the first semiconductor layer 104*c* has a thickness ranging from about 5 nm to about 9 nm. The first semiconductor layer 104*a* may be eventually removed to define a space for an etch stop layer to be formed therein. The first semiconductor layer 104*a* may have a composition different from the composition of the first semiconductor layers 104*b*, 104*c*, 104*d*. In some embodiments, the first semiconductor layers 104*a*, 104*b*, 104*c*, 104*d* include SiGe, and the first semiconductor layer 104*a* has a higher atomic percent Ge than that of the first semiconductor layers 104*b*, 104*c*, 104*d*. As a result, the first semiconductor layer 104*a* may be etched at a faster rate than the first semiconductor layers 104*b*, 104*c*, 104*d*. The thickness of the first semiconductor layer 104*a* may range from about 5 nm to about 30 nm.

The first and second semiconductor layers 104, 106 are formed by any suitable deposition process, such as epitaxy. By way of example, epitaxial growth of the layers of the stack of semiconductor layers 102 may be performed by a molecular beam epitaxy (MBE) process, a metalorganic chemical vapor deposition (MOCVD) process, and/or other suitable epitaxial growth processes.

Figure 2:
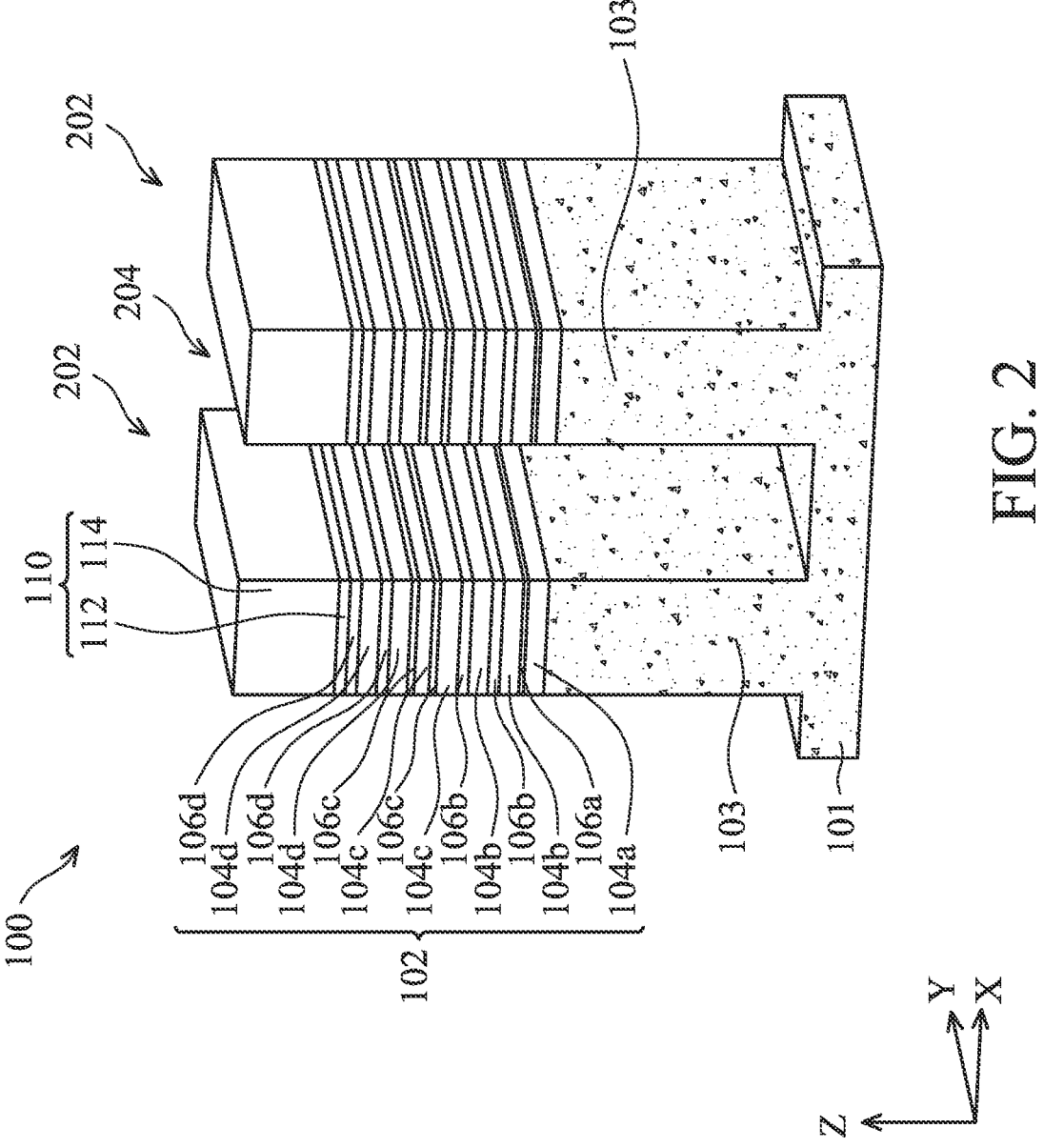

FIG. 2 is a perspective view of one of the various stages of manufacturing the semiconductor device structure 100, in accordance with some embodiments. As shown in FIG. 2, fins 202 are formed. In some embodiments, each fin 202 includes a substrate portion 103 formed from the substrate 101, a portion of the stack of semiconductor layers 102, and a portion of a mask structure 110. The mask structure 110 is formed over the stack of semiconductor layers 102 prior to forming the fins 202. The mask structure 110 may include an oxygen-containing layer 112 and a nitrogen-containing layer 114. The oxygen-containing layer 112 may be a pad oxide layer, such as a SiO$_2$ layer. The nitrogen-containing layer 114 may be a pad nitride layer, such as Si$_3$N$_4$. The mask structure 110 may be formed by any suitable deposition process, such as chemical vapor deposition (CVD) process.

The fins 202 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 202 by etching the stack of semiconductor layers 102 and the substrate 101. The etch process can include dry etch, wet etch, reactive ion etch (RIE), and/or other suitable processes. As shown in FIG. 2, two fins 202 are formed, but the number of the fins is not limited to two.

In some embodiments, the fins 202 may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 204 in unprotected regions through the mask structure 110, the stack of semiconductor layers 102, and into the substrate 101, thereby leaving the extending fins 202. The trenches 204 may be etched using a dry etch (e.g., RIE), a wet etch, and/or combination thereof.

As shown in FIG. 2, each fin 202 includes a plurality of second semiconductor layers 106, which includes a first group of second semiconductor layers 106*b*, a second group of second semiconductor layers 106*c*, and a third group of second semiconductor layers 106*d*. The second group of second semiconductor layers 106*c* may be disposed over the first group of second semiconductor layers 106*b*, and the third group of second semiconductor layers 106*d* may be disposed over the second group of second semiconductor layers 106c. The first, second, third groups of the second semiconductor layers 106b, 106c, 106d may be aligned along the Z direction, which may be substantially perpendicular to a major surface of the substrate 101. In some embodiments, at least two edges of the second semiconductor layers 106 are aligned along the Z direction. In some embodiments, the plurality of second semiconductor layers 106 includes a stack of second semiconductor layers 106 spaced apart from and aligned with each other.

Figure 3:
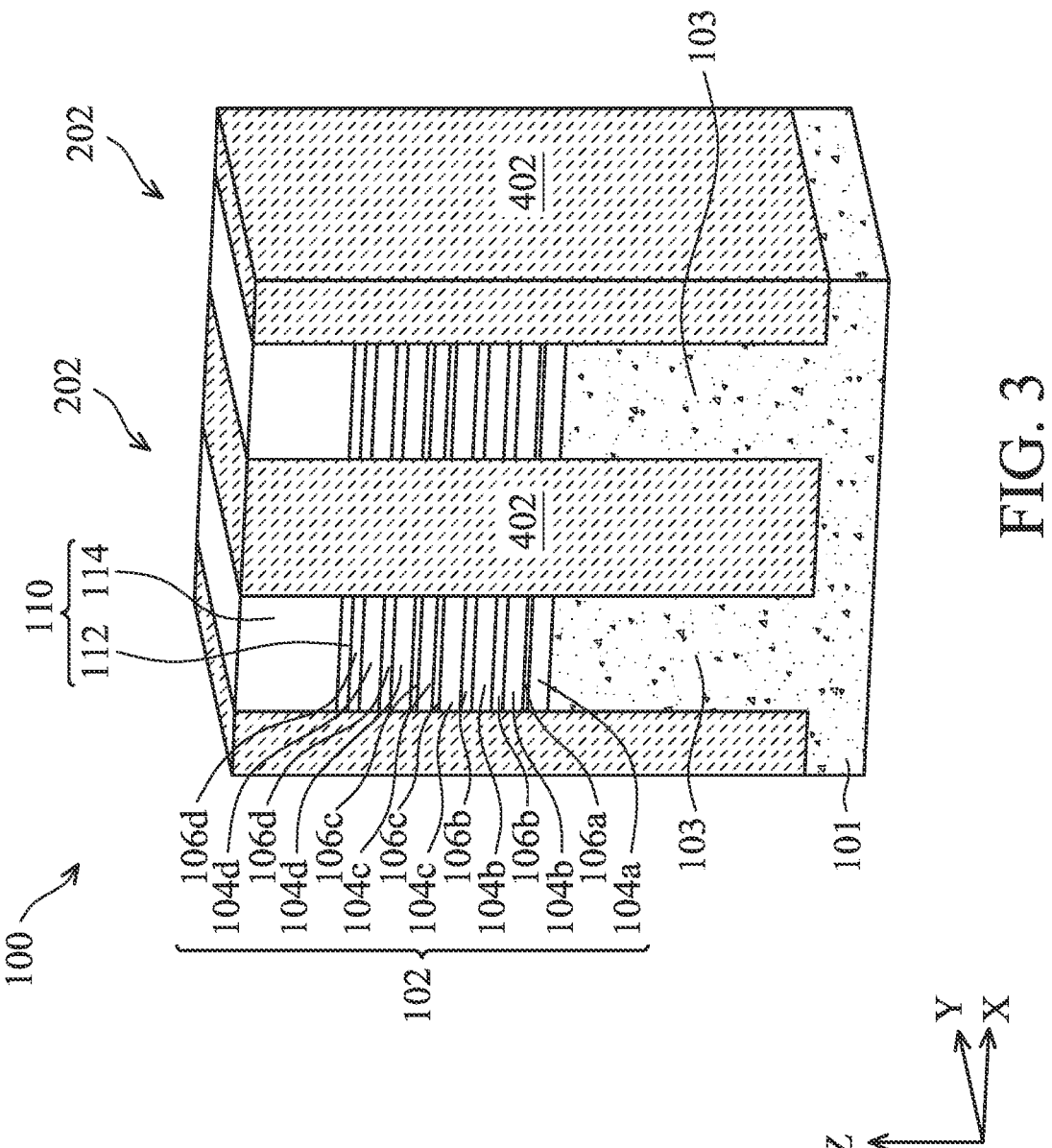

FIG. 3 is a perspective view of one of the various stages of manufacturing the semiconductor device structure 100, in accordance with some embodiments. As shown in FIG. 3, an insulating material 402 is formed on the substrate 101. The insulating material 402 fills the trench 204 (FIG. 2). The insulating material 402 may be first formed over the substrate 101 so that the fins 202 are embedded in the insulating material 402. Then, a planarization operation, such as a chemical mechanical polishing (CMP) process and/or an etch-back process, is performed such that the tops of the fins 202 (e.g., the nitrogen-containing layer 114) are exposed from the insulating material 402, as shown in FIG. 3. The insulating material 402 may be made of an oxygen-containing material, such as silicon oxide or fluorine-doped silicate glass (FSG); a nitrogen-containing material, such as silicon nitride, silicon oxynitride (SiON), SiOCN, SiCN; a low-k dielectric material; or any suitable dielectric material. The insulating material 402 may be formed by any suitable method, such as low-pressure chemical vapor deposition (LPCVD), plasma enhanced CVD (PECVD) or flowable CVD (FCVD).

Figure 4:
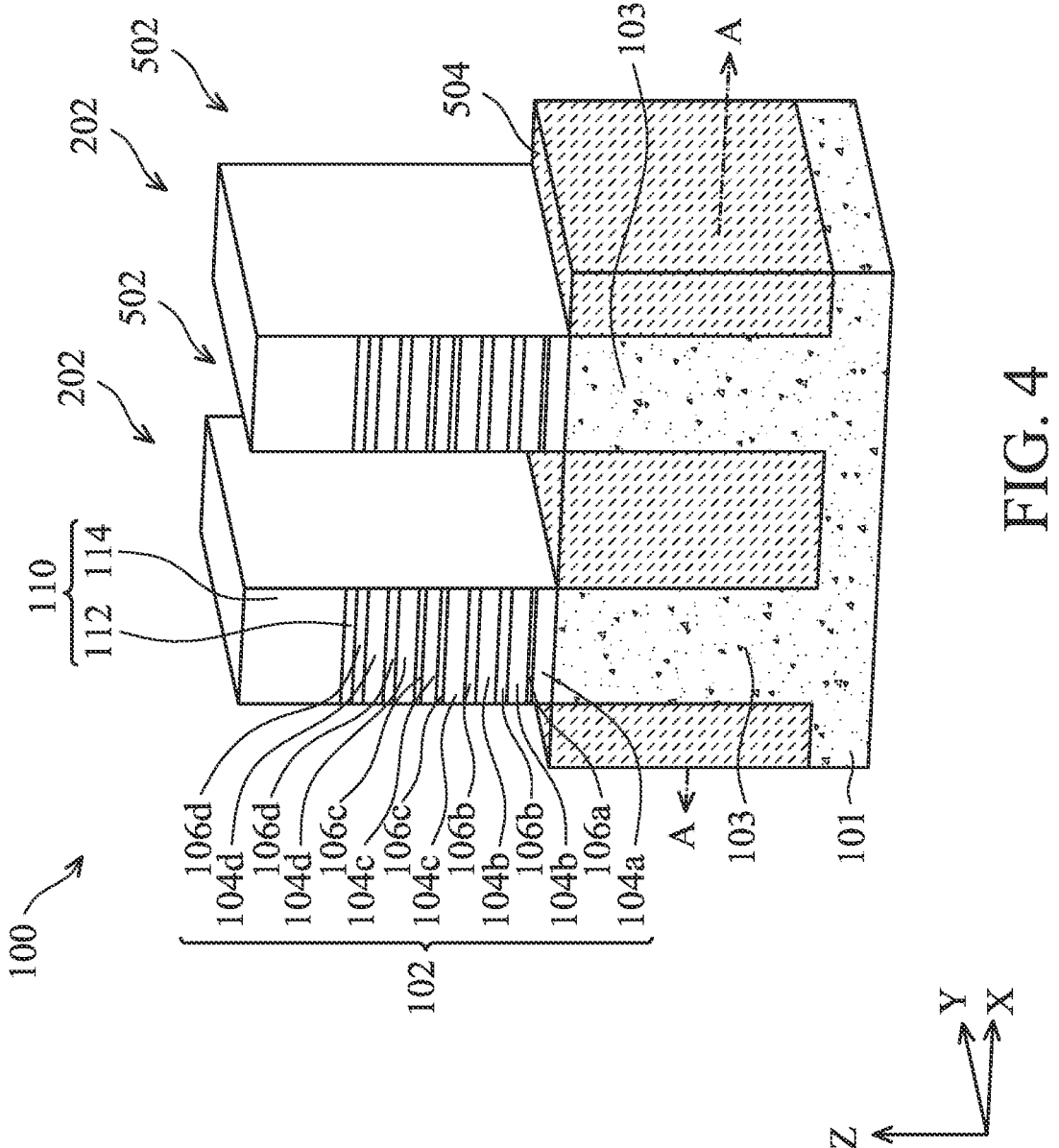

Next, as shown in FIG. 4, the insulating material 402 may be recessed by removing a portion of the insulating material 402 located between adjacent fins 202 to form trenches 502. The trenches 502 may be formed by any suitable removal process, such as dry etch or wet etch that selectively removes the insulating material 402 but not the semiconductor material of the liner 304. The recessed insulating material 402 may be the shallow trench isolation (STI). The insulating material 402 includes a top surface 504 that may be level with or below a surface of the first semiconductor layers 104a in contact with the substrate portions 103 of the substrate 101.

Figure 5:
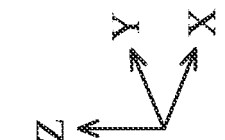
Figure 5:
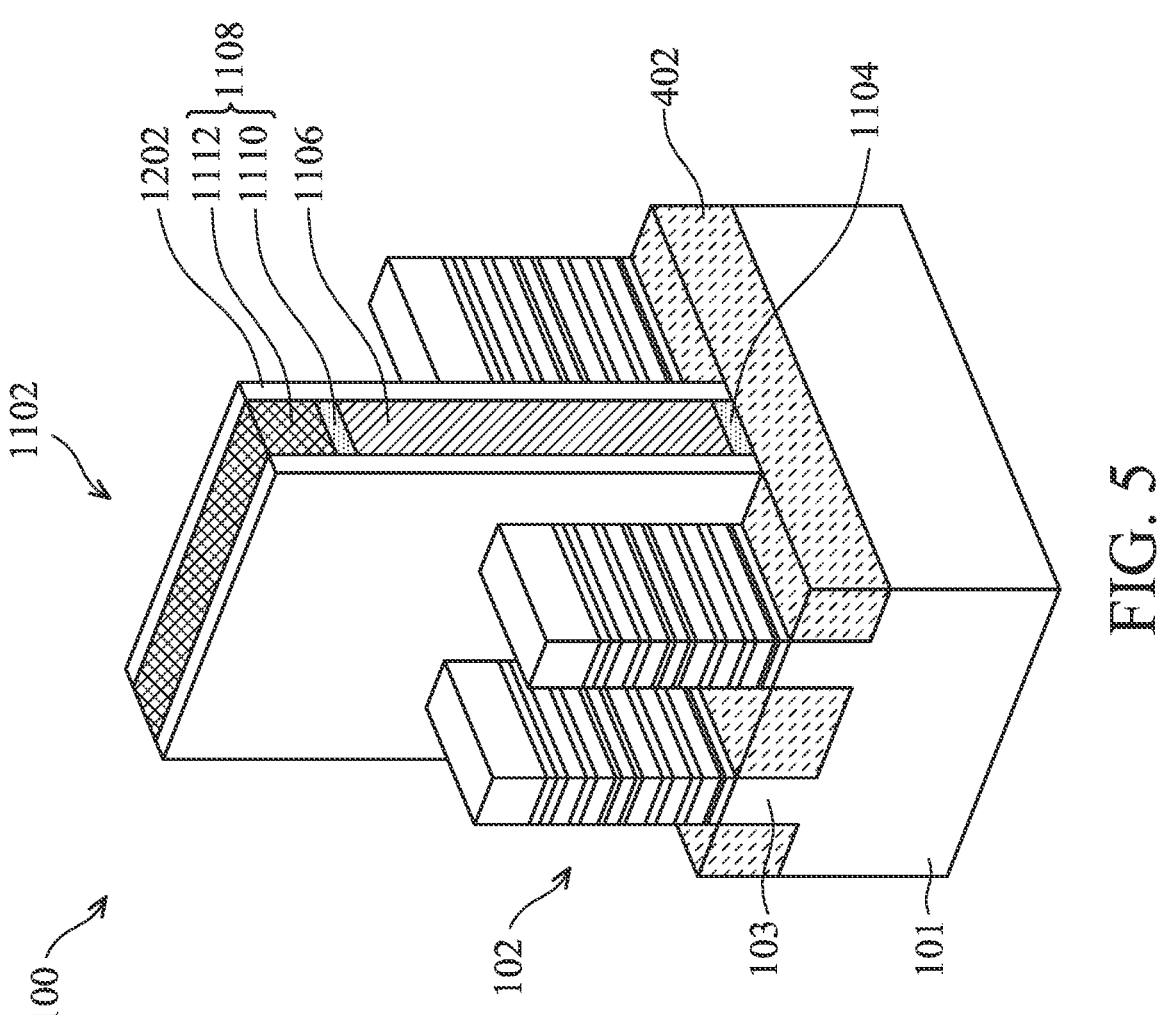

Next, as shown in FIG. 5, one or more sacrificial gate stacks 1102 are formed on the semiconductor device structure 100. The sacrificial gate stack 1102 may include a sacrificial gate dielectric layer 1104, a sacrificial gate electrode layer 1106, and a mask structure 1108. The sacrificial gate dielectric layer 1104 may include one or more layers of dielectric material, such as $SiO_2$, SiN, a high-k dielectric material, and/or other suitable dielectric material. In some embodiments, the sacrificial gate dielectric layer 1104 may be deposited by a CVD process, a sub-atmospheric CVD (SACVD) process, a FCVD process, an ALD process, a PVD process, or other suitable process. The sacrificial gate electrode layer 1106 may include polycrystalline silicon (polysilicon). The mask structure 1108 may include an oxygen-containing layer 1110 and a nitrogen-containing layer 1112. In some embodiments, the sacrificial gate electrode layer 1106 and the mask structure 1108 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 1102 may be formed by first depositing blanket layers of the sacrificial gate dielectric layer 1104, the sacrificial gate electrode layer 1106, and the mask structure 1108, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 1102, the stacks of semiconductor layers 102 of the fins 202 are partially exposed on opposite sides of the sacrificial gate stack 1102. As shown in FIG. 5, one sacrificial gate stack 1102 is formed, but the number of the sacrificial gate stacks 1102 is not limited to one. Two or more sacrificial gate stacks 1102 may be arranged along the Y direction in some embodiments. Three sacrificial gate stacks 1102 are arranged along the Y direction in some embodiments, as shown in FIG. 7A.

As shown in FIG. 5, a spacer 1202 is formed on the sidewalls of the sacrificial gate stacks 1102. The liners 302, 304 are omitted for clarity. The spacer 1202 may be formed by first depositing a conformal layer that is subsequently etched back to form sidewall spacers 1202. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 202, leaving the spacers 1202 on the vertical surfaces, such as the sidewalls of sacrificial gate stack 1102. The spacer 1202 may be made of a dielectric material such as silicon oxide, silicon nitride, silicon carbide, silicon oxynitride, SiCN, silicon oxycarbide, SiOCN, and/or combinations thereof. In some embodiments, the spacer 1202 includes multiple layers, such as main spacer walls, liner layers, and the like.

Figure 6:
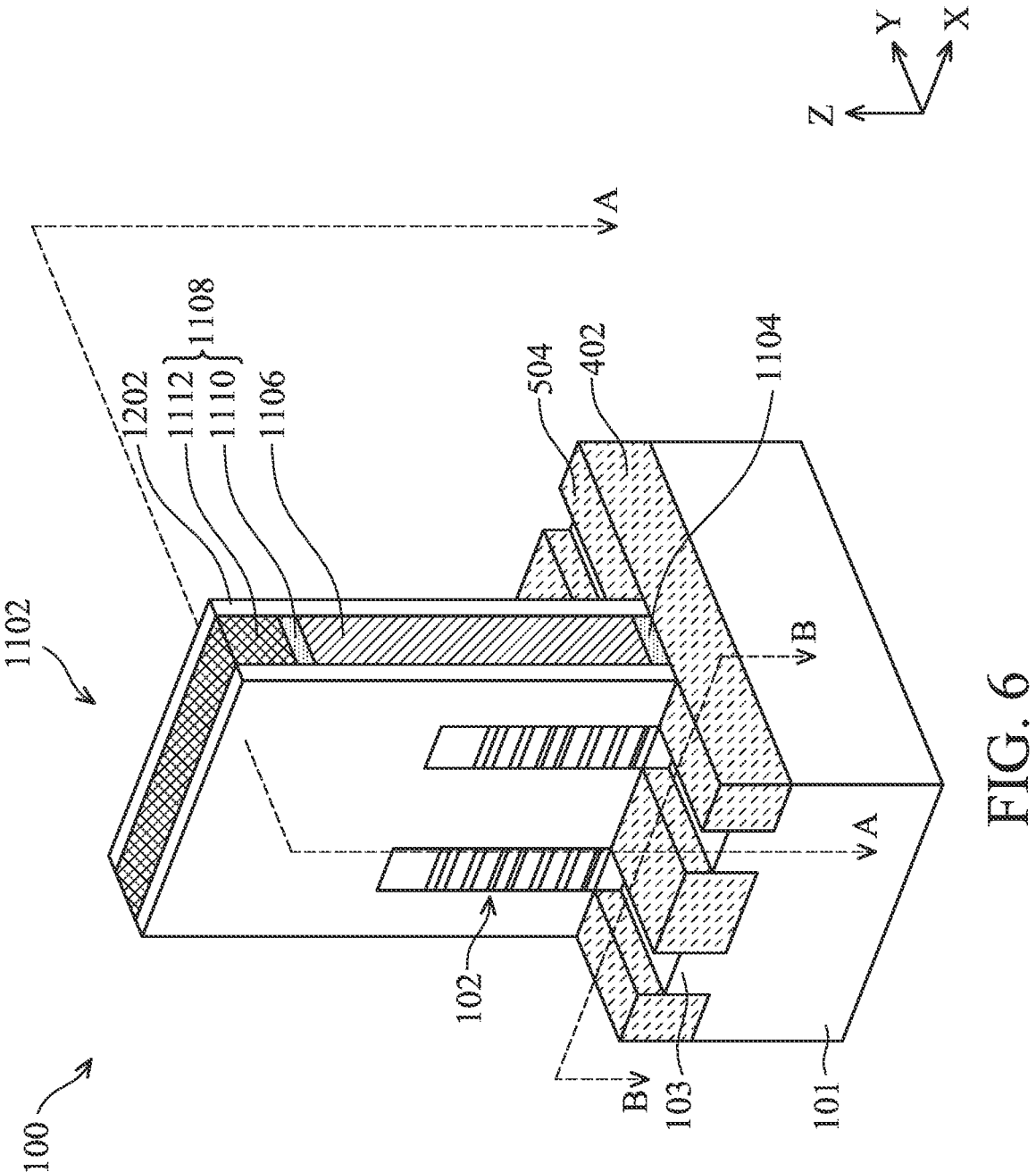

Next, as shown in FIG. 6, exposed portions of the fins 202 not covered by the sacrificial gate stacks 1102 and the spacers 1202 are recessed by using one or more suitable etch processes, such as dry etch, wet etch, or a combination thereof. In some embodiments, exposed portions of the stacks of semiconductor layers 102 of the fins 202 are removed, exposing portions of the substrate portions 103. As shown in FIG. 6, the exposed portions of the fins 202 are recessed to a level at or below the top surface 504 of the insulating material 402. The recess processes may include an etch process that recesses the exposed portions of the fins 202 but not the spacers 1202 and the nitrogen-containing layer 1112.

Figure 7B:
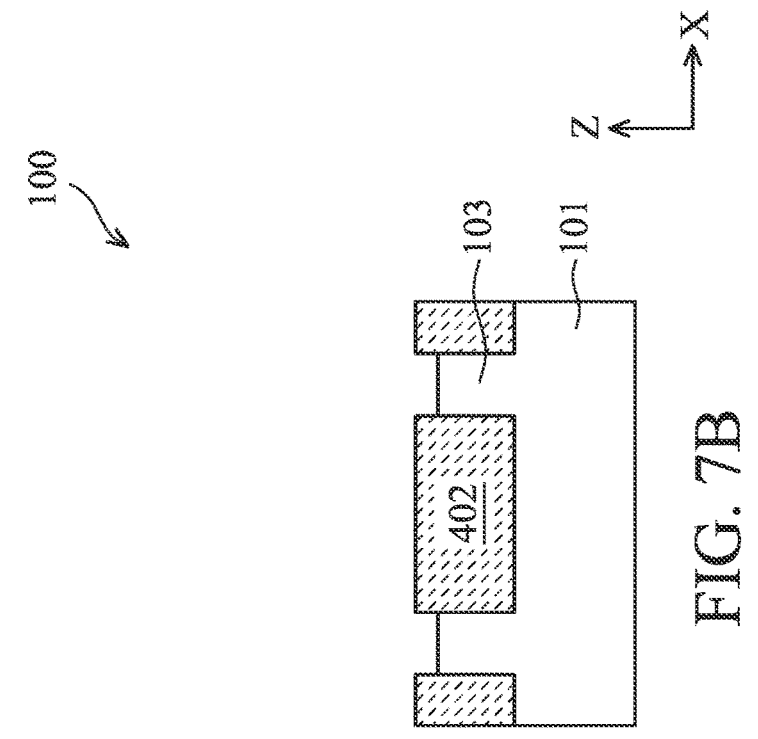
Figure 7A:
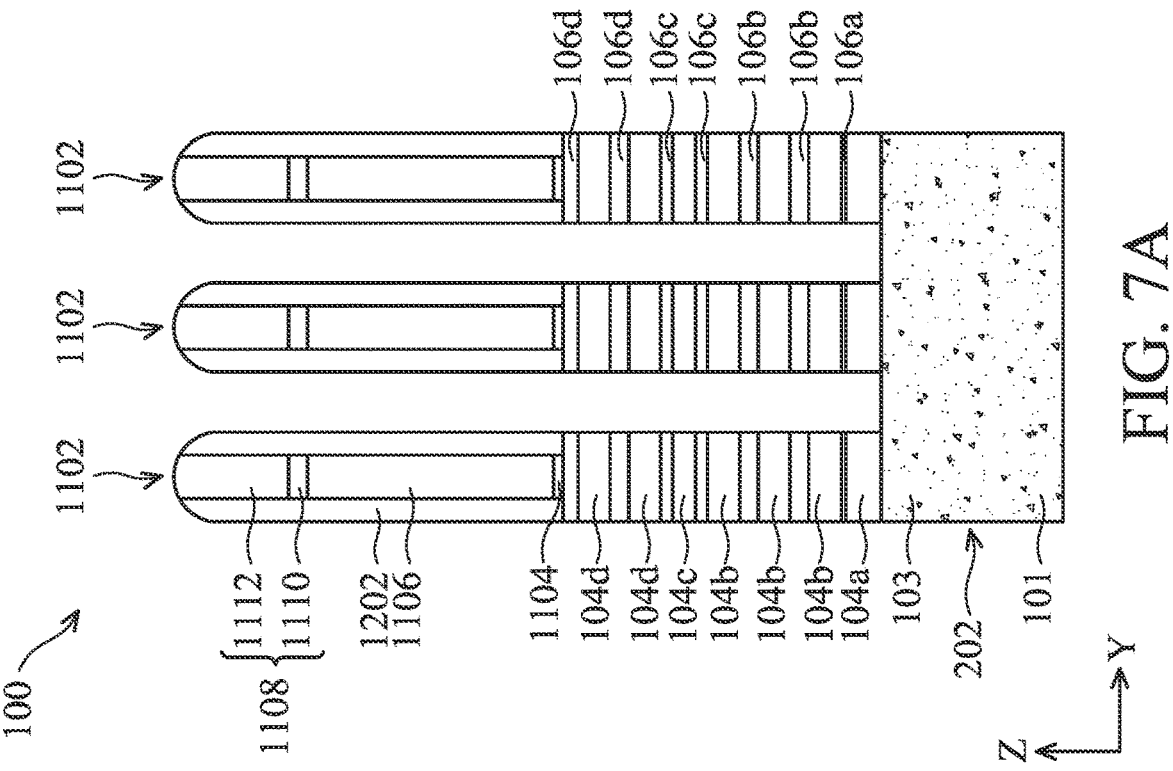

FIGS. 7A-16A are cross-sectional side views of various stages of manufacturing the semiconductor device structure taken along line A-A of FIG. 6, in accordance with some embodiments. FIGS. 7B-16B are cross-sectional side views of various stages of manufacturing the semiconductor device structure taken along line B-B of FIG. 6, in accordance with some embodiments. As shown in FIGS. 7A and 7B, three sacrificial gate stacks 1102 are disposed on the fin 202, and portions of the stack of semiconductor layers 102 not covered by the sacrificial gate stacks 1102 are removed to expose the substrate portions 103. At this stage, end portions of the stacks of semiconductor layers 102 under the sacrificial gate stacks 1102 and the spacers 1202 have substantially flat surfaces which may be flush with corresponding spacers 1202. In some embodiments, the end portions of the stacks of semiconductor layers 102 under the sacrificial gate stacks 1102 and spacers 1202 are slightly horizontally etched.

Figure 8B:
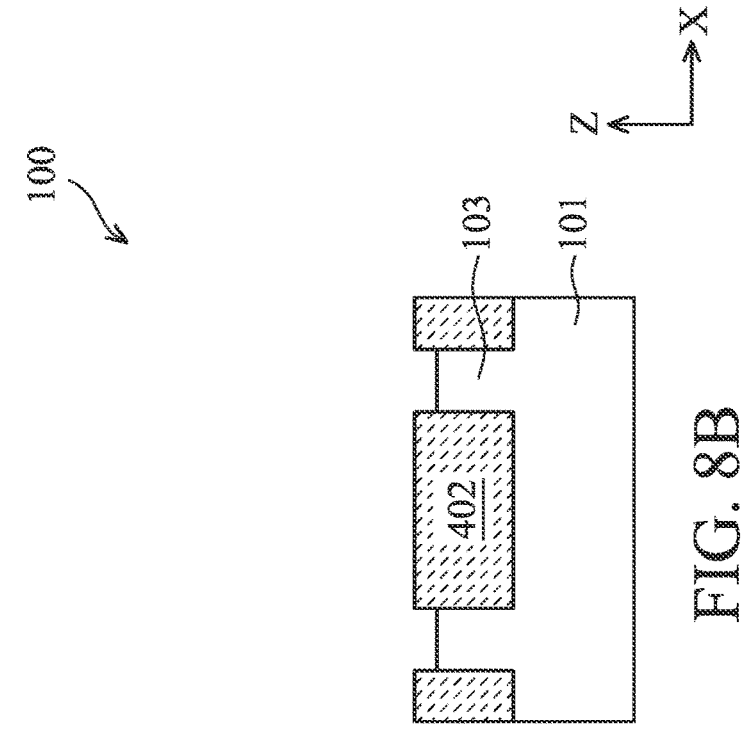
Figure 8A:
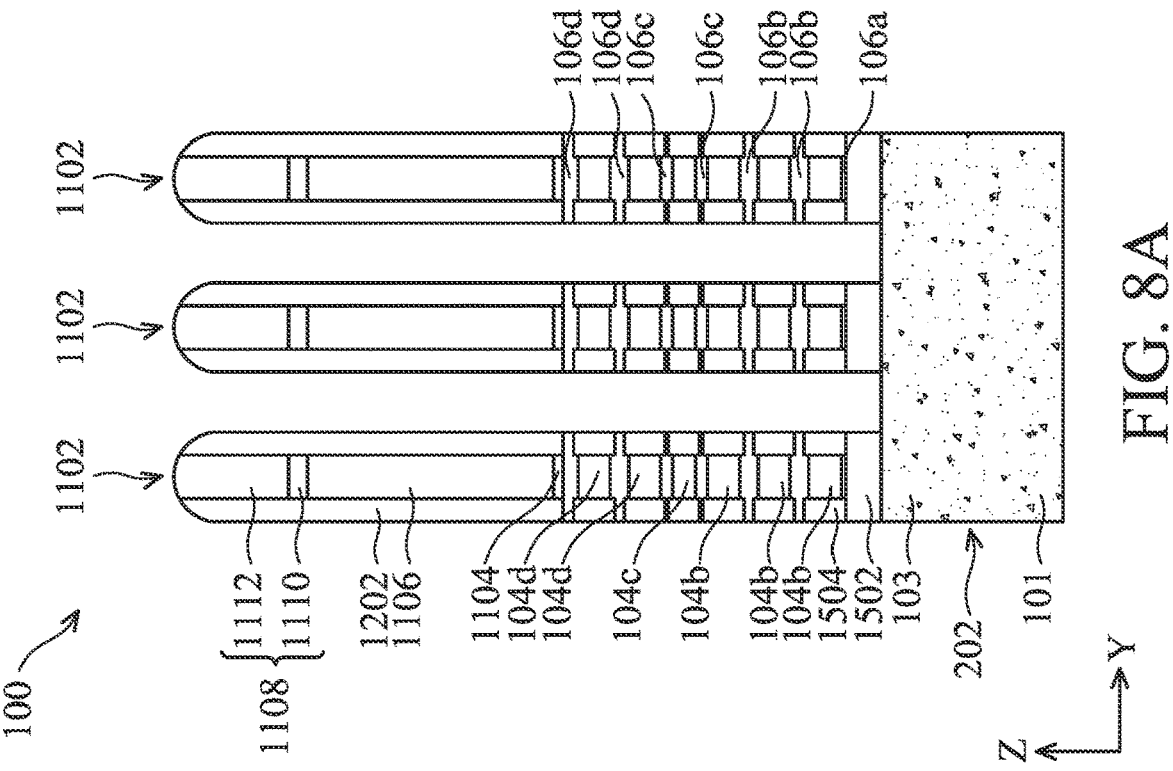

As shown in FIGS. 8A and 8B, after recessing the exposed materials not covered by the sacrificial gate stacks 1102, the first semiconductor layer 104a, and the edge portions of each first semiconductor layer 104b, 104c, 104d are removed. In some embodiments, the removal is a selective wet etch process. For example, in cases where the first semiconductor layers 104b, 104c, 104d are made of SiGe having a first atomic percent germanium, the first semiconductor layer 104a is made of SiGe having a second atomic percent germanium greater than the first atomic percent germanium, and the second semiconductor layers 106a, 106b, 106c, 106d are made of silicon, a selective wet etch using an ammonia and hydrogen peroxide mixtures (APM) may be used. With the APM etch, the first semiconductor layer 104a is etched at a first etch rate, the first semiconductor layers 104b, 104c, 104d are etched at a second etch rate slower than the first etch rate due to different atomic percentages of germanium in the layers, and the second semiconductor layers 106a, 106b, 106c, 106d are etched at a third etch rate slower than the second etch rate. As a result, the first semiconductor layer 104a may be completely removed, while edge portions of the first semiconductor layers 104b, 104c, 104d are removed, and the second semiconductor layers 106a, 106b, 106c, 106d are substantially unchanged. In some embodiments, the selective removal process may include SiGe oxidation followed by a SiGeOx removal.

Next, as show in FIGS. 8A and 8B, a dielectric layer 1502 is formed in the space created by the removal of the first semiconductor layer 104a, and dielectric spacers 1504 are formed in the space created by the removal of the edge portions of the first semiconductor layers 104b, 104c, 104d. In other words, the first semiconductor layer 104a is replaced with the dielectric layer 1502. In some embodiments, the dielectric spacers 1504 may be flush with the spacers 1202. In some embodiments, small amount of each second semiconductor layers 106 may be removed during the removal process, and the dielectric spacers 1504 disposed on opposite sides of the first semiconductor layers 104 may be thicker than the corresponding first semiconductor layer 104, as shown in FIG. 8A. In some embodiments, edge portions of the second semiconductor layer 106a are removed, and the sides of the second semiconductor layer 106a are in contact with the dielectric spacers 1504.

In some embodiments, the dielectric layer 1502 may include SiO$_2$, SiN, SiCN, SiOC, SiOCN, HfO2, ZrOx, ZrAlOx, HfAlOx, HfSiOx, AlOx, or other suitable dielectric material. In some embodiments, the dielectric layer 1502 may include TiO, TaO, LaO, YO, TaCN, or ZrN. The dielectric spacers 1504 may include SiON, SiCN, SiOC, SiOCN, or SiN. In some embodiments, the dielectric layer 1502 and the dielectric spacers 1504 include the same dielectric material. For example, the dielectric layer 1502 and the dielectric spacers 1504 may be formed by first forming a conformal dielectric layer using a conformal deposition process, such as ALD, followed by an anisotropic etching to remove portions of the conformal dielectric layer other than the dielectric layer 1502 and the dielectric spacers 1504. The dielectric layer 1502 and the dielectric spacers 1504 may be protected by the second semiconductor layers 106a, 106b, 106c, 106d during the anisotropic etching process. The dielectric layer 1502 may have a thickness ranging from about 5 nm to about 30 nm. The dielectric layer 1502 serves to protect the channel regions during the subsequent removal of the substrate 101. Thus, if the thickness of the dielectric layer 1502 is less than about 5 nm, the dielectric layer 1502 may not be sufficient to protect the channel regions. On the other hand, if the thickness of the dielectric layer 1502 is greater than about 30 nm, the manufacturing cost is increased without significant advantage.

Figure 9B:
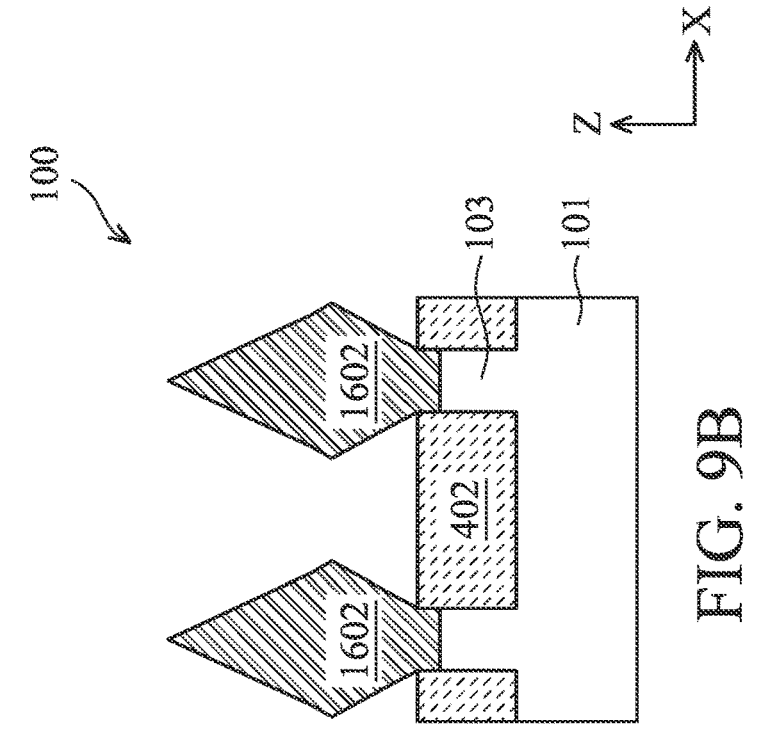
Figure 9A:
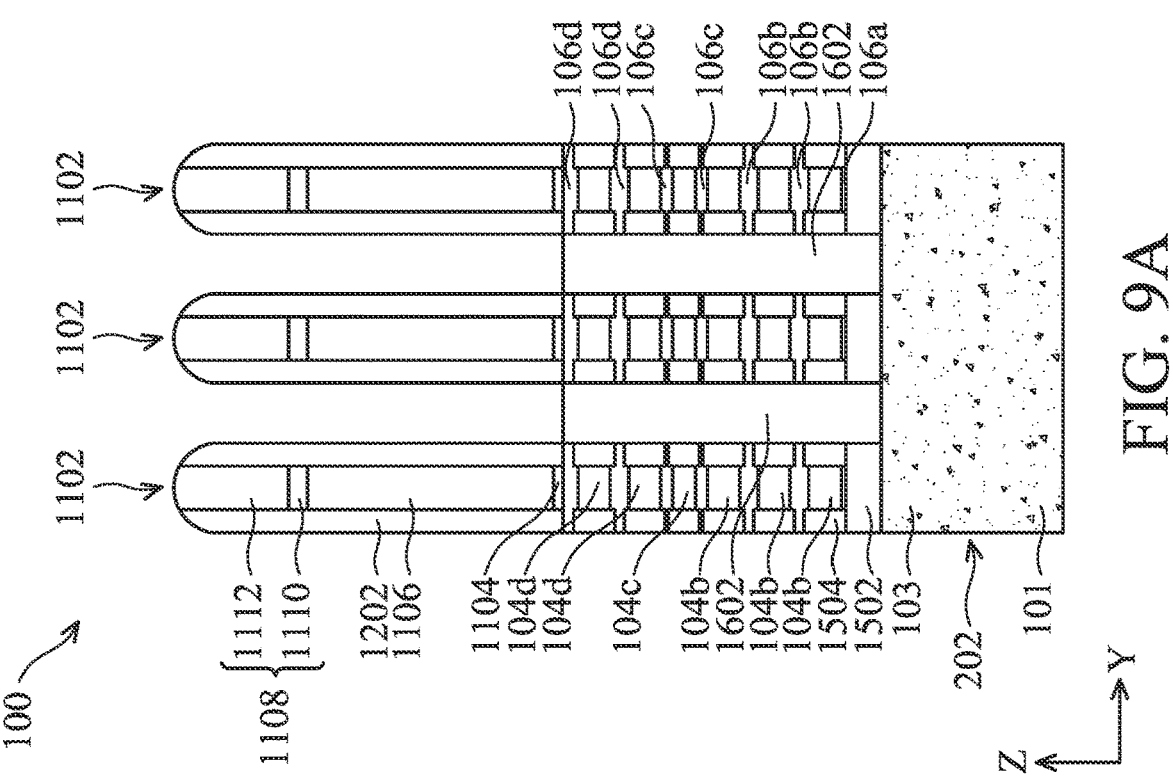

Next, as shown in FIGS. 9A and 9B, S/D epitaxial features 1602 are formed on the substrate portions 103 of the fins 202. The S/D epitaxial feature 1602 may include one or more layers of Si, SiP, SiC and SiCP for an NFET or Si, SiGe, Ge for a PFET. In some embodiments, the S/D epitaxial features 1602 includes one or more layers of Si, SiGe, and Ge for a PFET. The S/D epitaxial features 1602 may grow both vertically and horizontally to form facets, which may correspond to crystalline planes of the material used for the substrate portions 103. The S/D epitaxial features 1602 may be formed by an epitaxial growth method using CVD, ALD or MBE. The S/D epitaxial features 1602 are in contact with the second semiconductor layers 106b, 106c, 106d and dielectric spacers 1504, as shown in FIG. 9A. The S/D epitaxial features 1602 may be the S/D regions. In this disclosure, a source region and a drain region are interchangeably used, and the structures thereof are substantially the same.

Figure 10B:
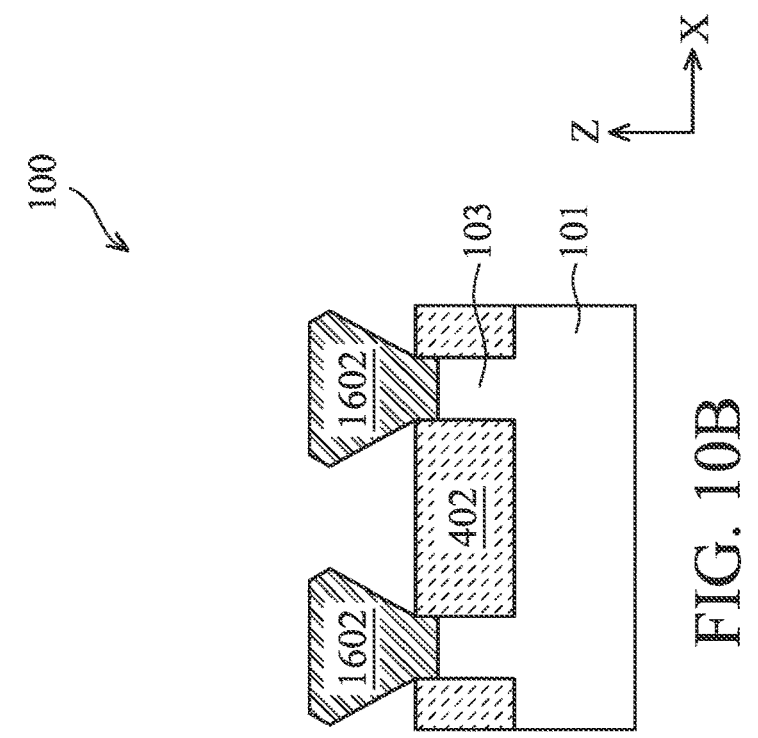
Figure 10A:
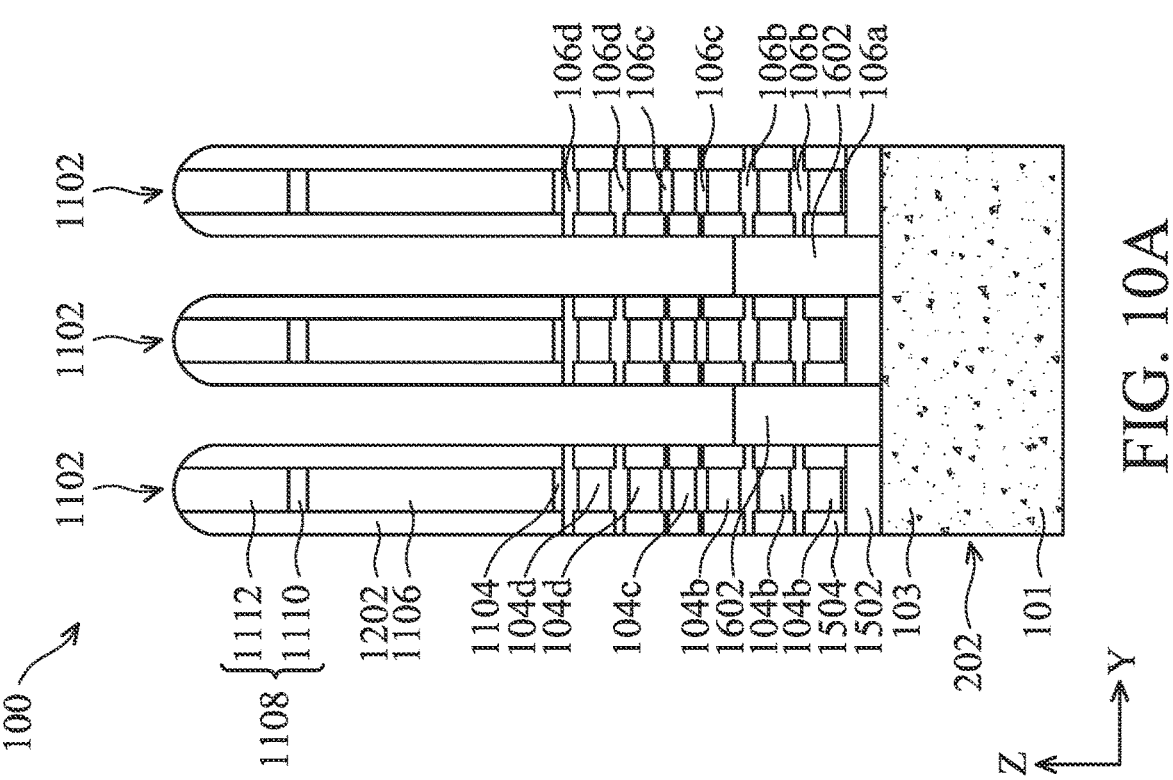

Next, as shown in FIGS. 10A and 10B, the S/D epitaxial features 1602 are recessed by removing a portion of each S/D epitaxial feature 1602. The recess of the S/D epitaxial features 1602 may be performed by any suitable process, such as dry etch or wet etch that selectively removes a portion of each S/D epitaxial feature 1602 but not the dielectric materials of the nitrogen-containing layer 1112, the spacer 1202, and the insulating material 402. As shown in FIG. 10A, the S/D epitaxial features 1602 are in contact with the second semiconductor layers 106b. In some embodiments, the semiconductor device structure 100 includes a nanostructure PFET having a source epitaxial feature 1602 and a drain epitaxial feature 1602 both in contact with one or more second semiconductor layers 106b, or one or more channels. In some embodiments, the nanostructure PFET includes two second semiconductor layers 106b, as shown in FIG. 10A.

Figure 11B:
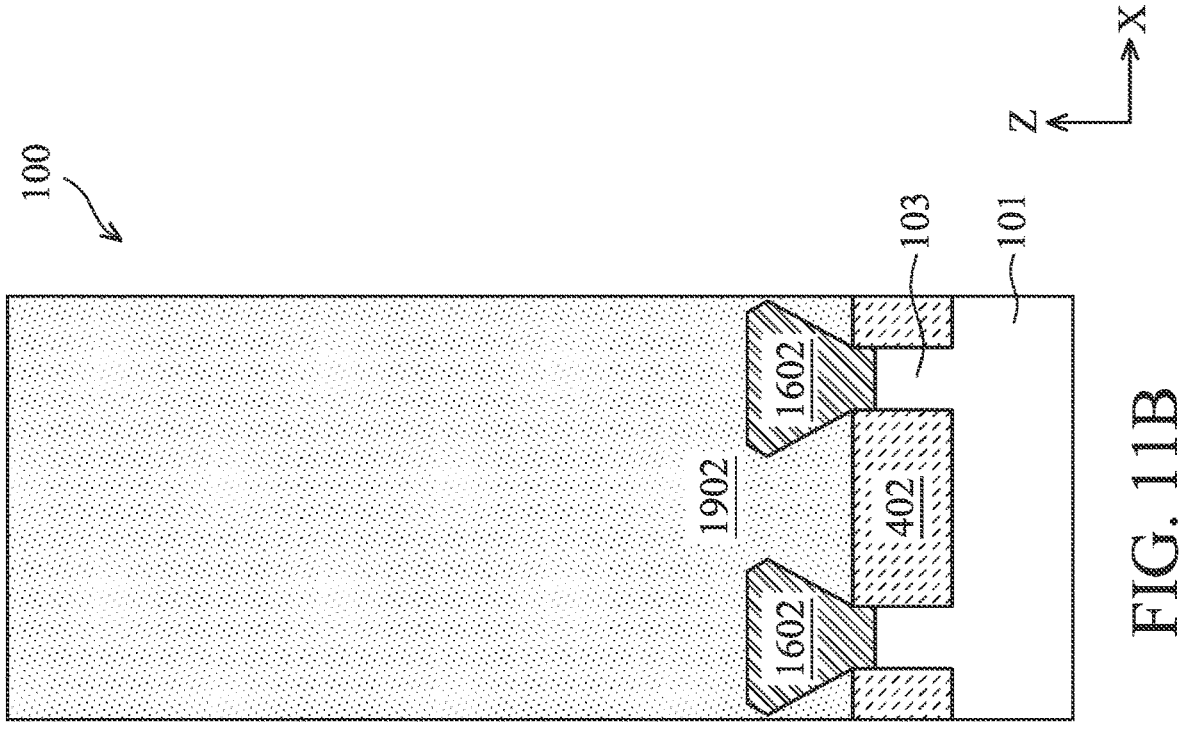
Figure 11A:
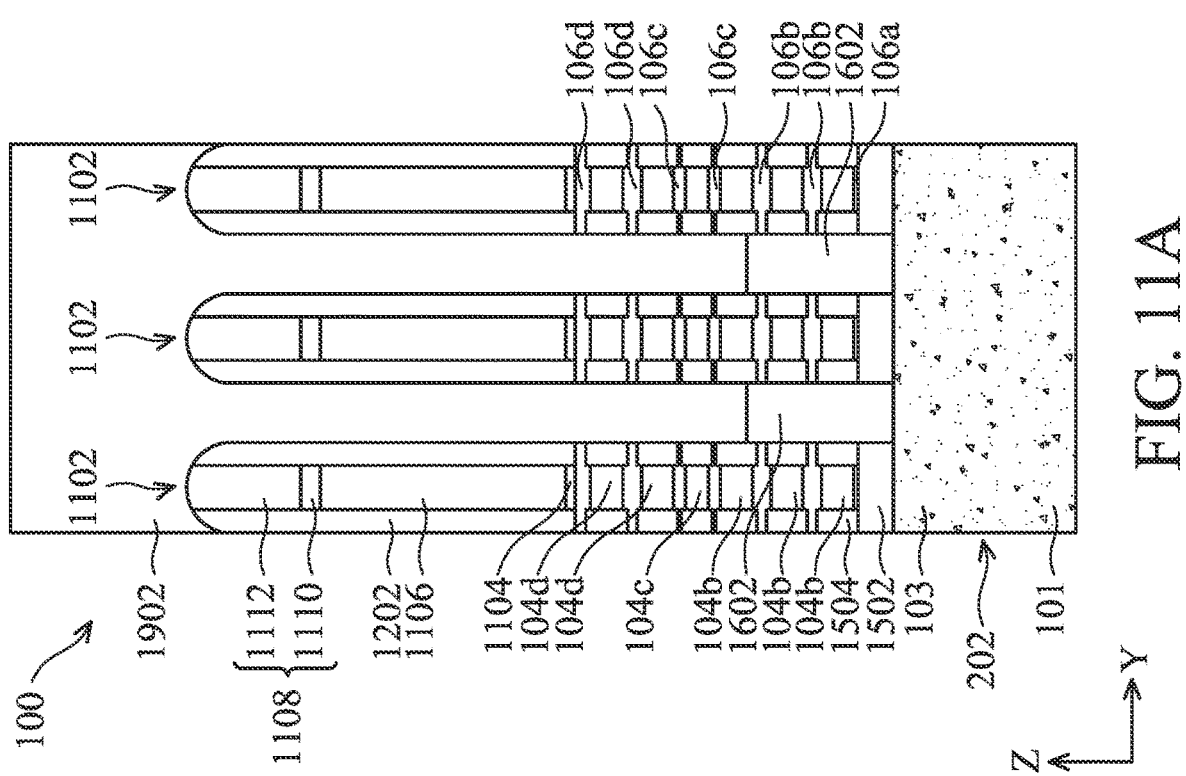

Next, as shown in FIGS. 11A and 11B, a dielectric material 1902 is formed on the exposed surfaces of the semiconductor device structure 100. In some embodiments, the dielectric material 1902 is formed on the S/D epitaxial features 1602 and the insulating material 402. The dielectric material 1902 may include a material different from the nitrogen-containing layer 1112, the spacer 1202, and the dielectric spacers 1504. In some embodiments, the dielectric material 1902 an oxide that is formed by FCVD. In some embodiments, the dielectric material 1902 may be formed by ALD. In some embodiments, the dielectric material 1902 includes a material different from the insulating material 402.

Figure 12B:
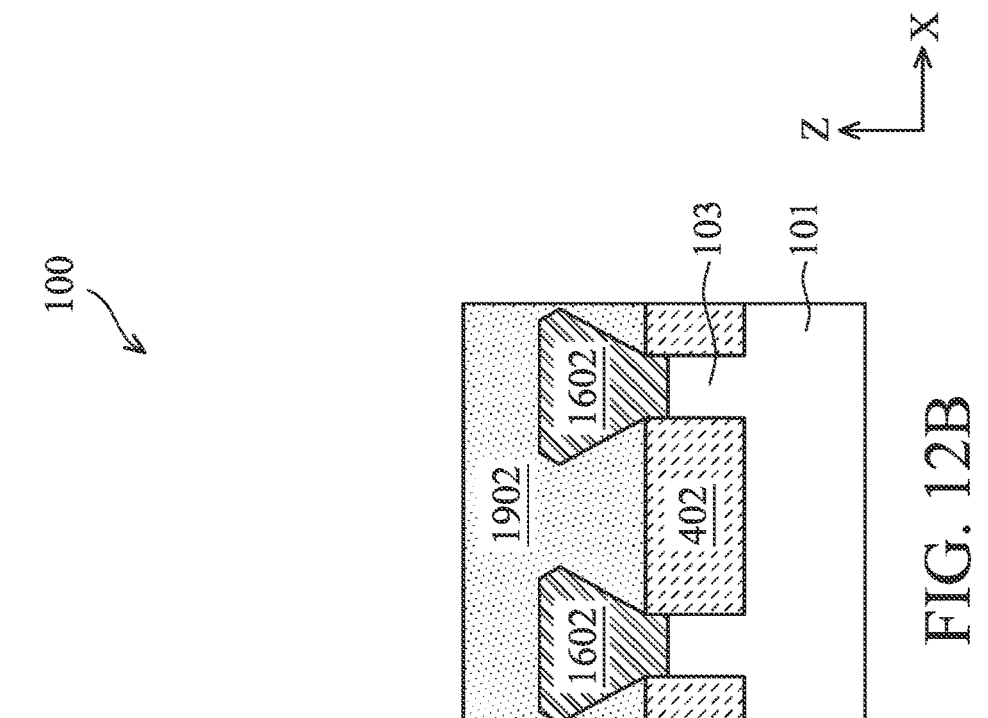
Figure 12A:
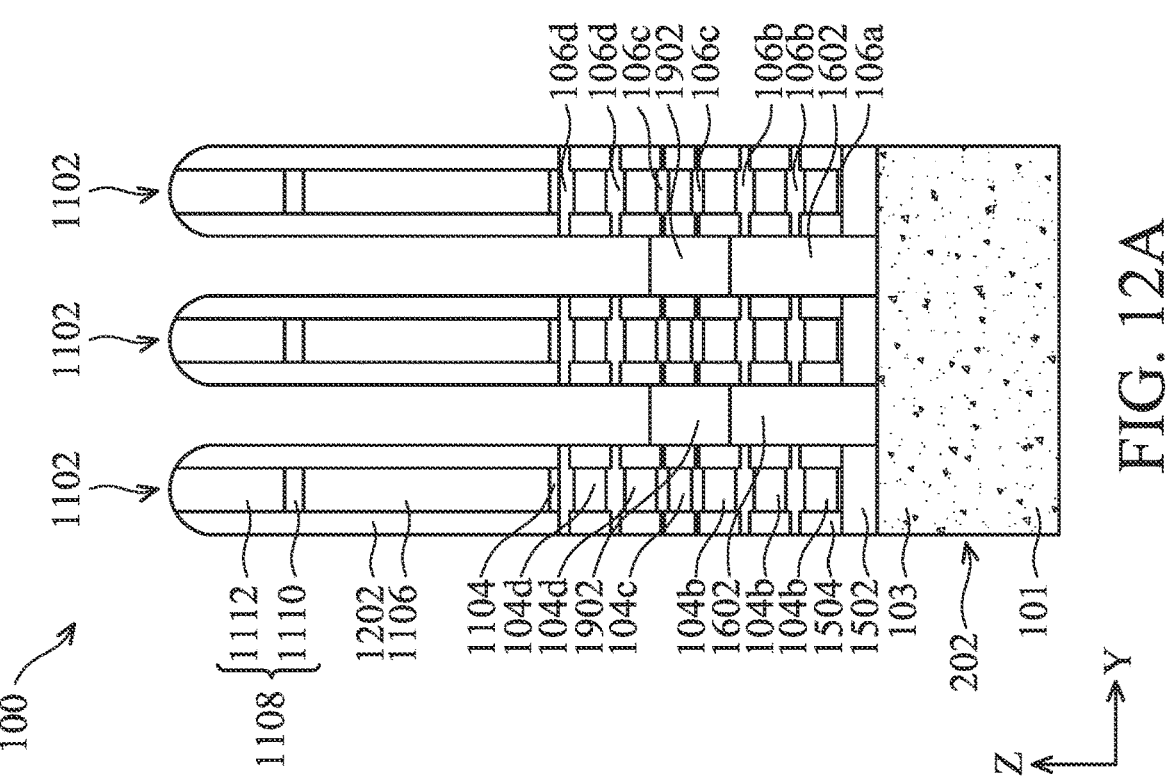

Next, as shown in FIGS. 12A and 12B, the dielectric material 1902 is recessed to a level below the level of the second semiconductor layers 106d. The recess of the dielectric material 1902 may be performed by any suitable process, such as dry etch or wet etch that selectively removes a portion of the dielectric material 1902 but not the nitrogen-containing layer 1112, the spacer 1202, the second semiconductor layers 106, and the dielectric spacers 1504. The recessed dielectric material 902 may be in contact with the second semiconductor layers 106c.

Figure 13B:
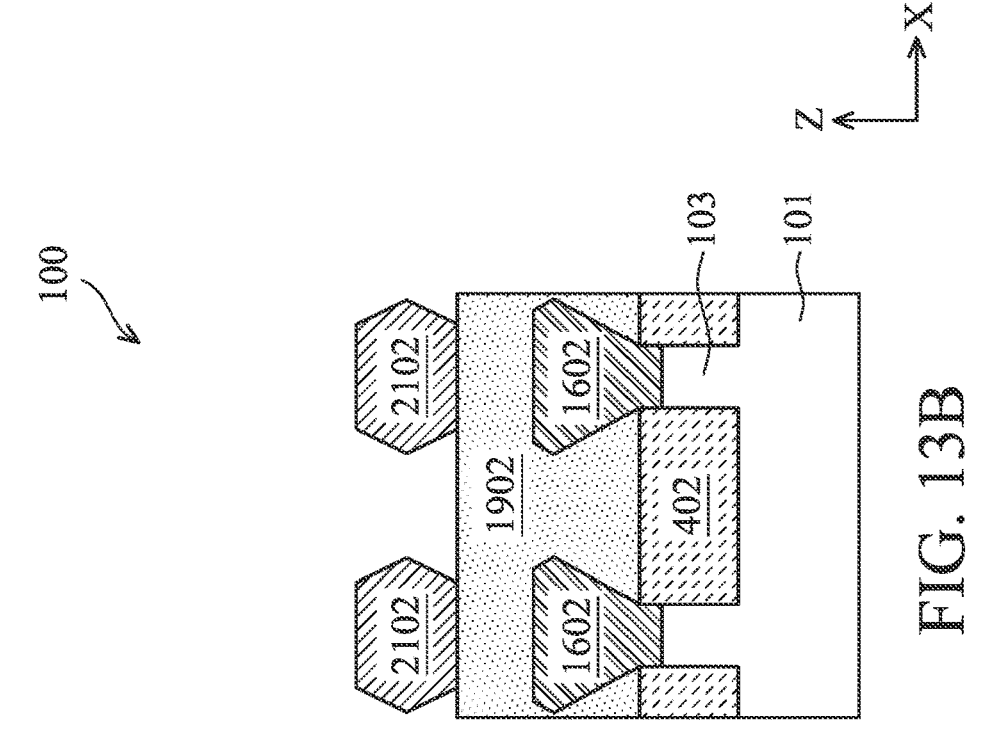
Figure 13A:
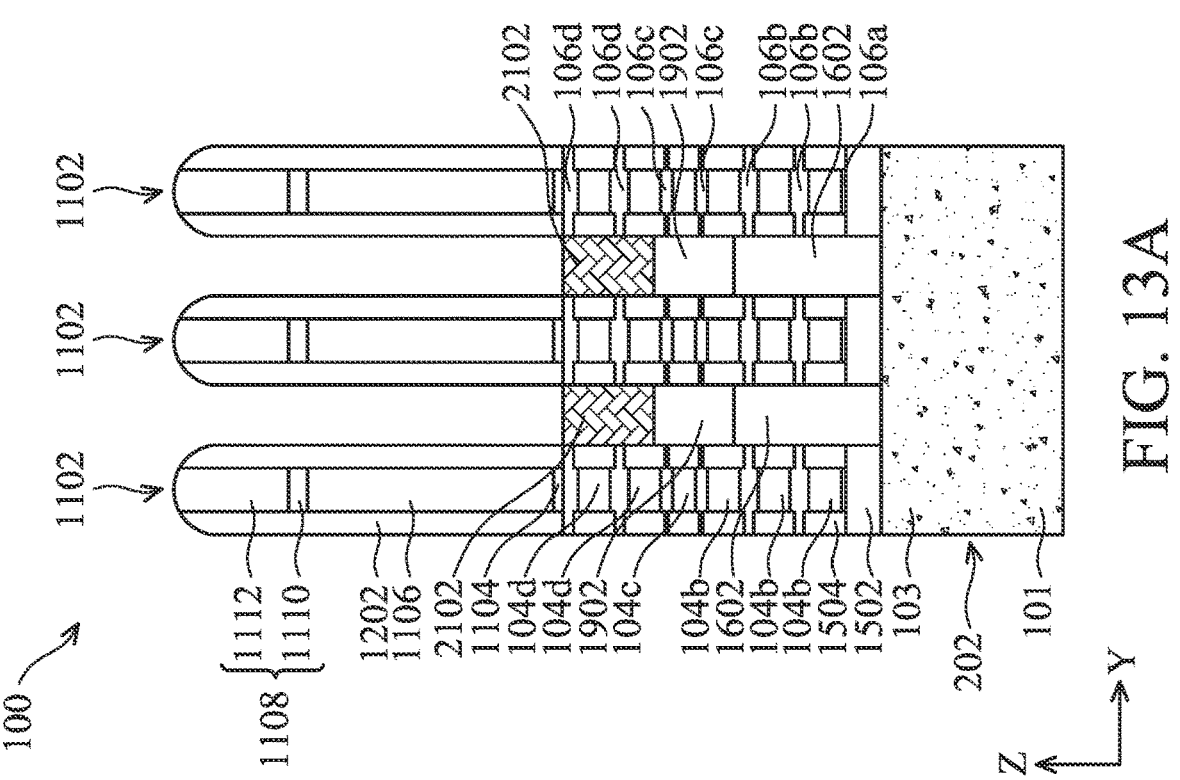

Next, as shown in FIGS. 13A and 13B, S/D epitaxial features 2102 are formed on the dielectric material 1902. The S/D epitaxial feature 2102 may include one or more layers of Si, SiP, SiC and SiCP for an NFET or Si, SiGe, Ge for a PFET. In some embodiments, the S/D epitaxial features 2102 includes one or more layers of Si, SiP, SiC and SiCP for an NFET. The S/D epitaxial features 2102 may be formed from the second semiconductor layers 106*d*. The S/D epitaxial features 2102 may grow both vertically and horizontally to form facets, which may correspond to crystalline planes of the material used for the second semiconductor layers 106*d*. The S/D epitaxial features 2102 may be formed by an epitaxial growth method using CVD, ALD or MBE. The S/D epitaxial features 2102 may be the S/D regions.

The semiconductor device structure 100 shown in FIGS. 13A and 13B can reduce the area of semiconductor devices, such as SRAMs having NFETs and PFETs. The source regions of the NFETs and PFETs may be vertically stacked, and the drain regions of the NFETs and the PFETs may be vertically stacked to increase the density of the FETs. The source of the NFET and the source of the PFET may be separated by the dielectric material 1902.

Figure 14B:
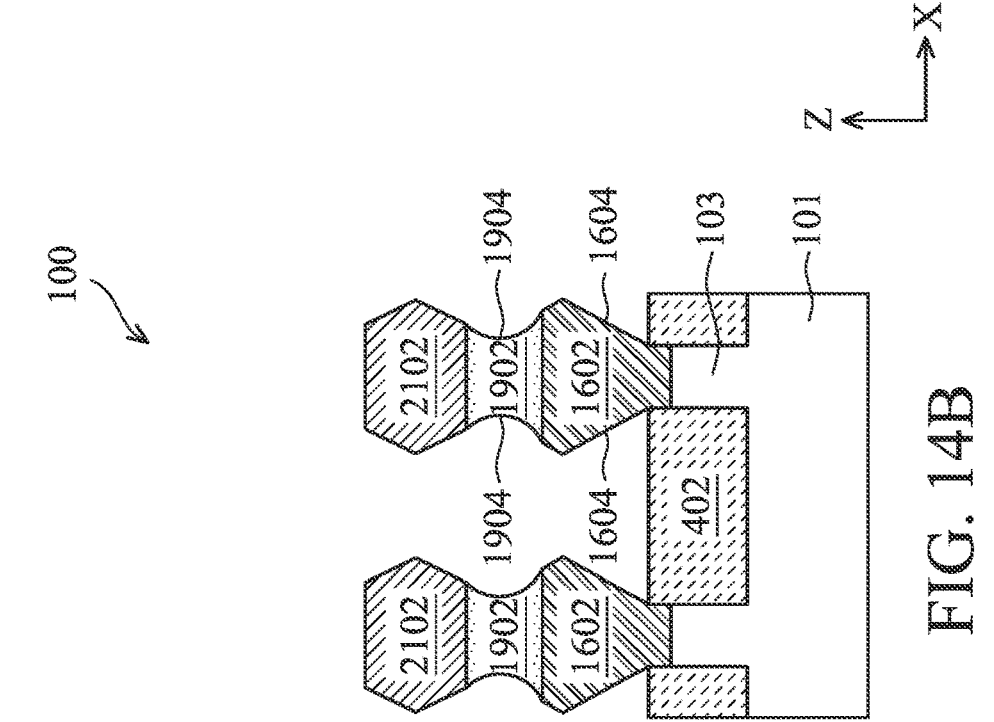
Figure 14A:
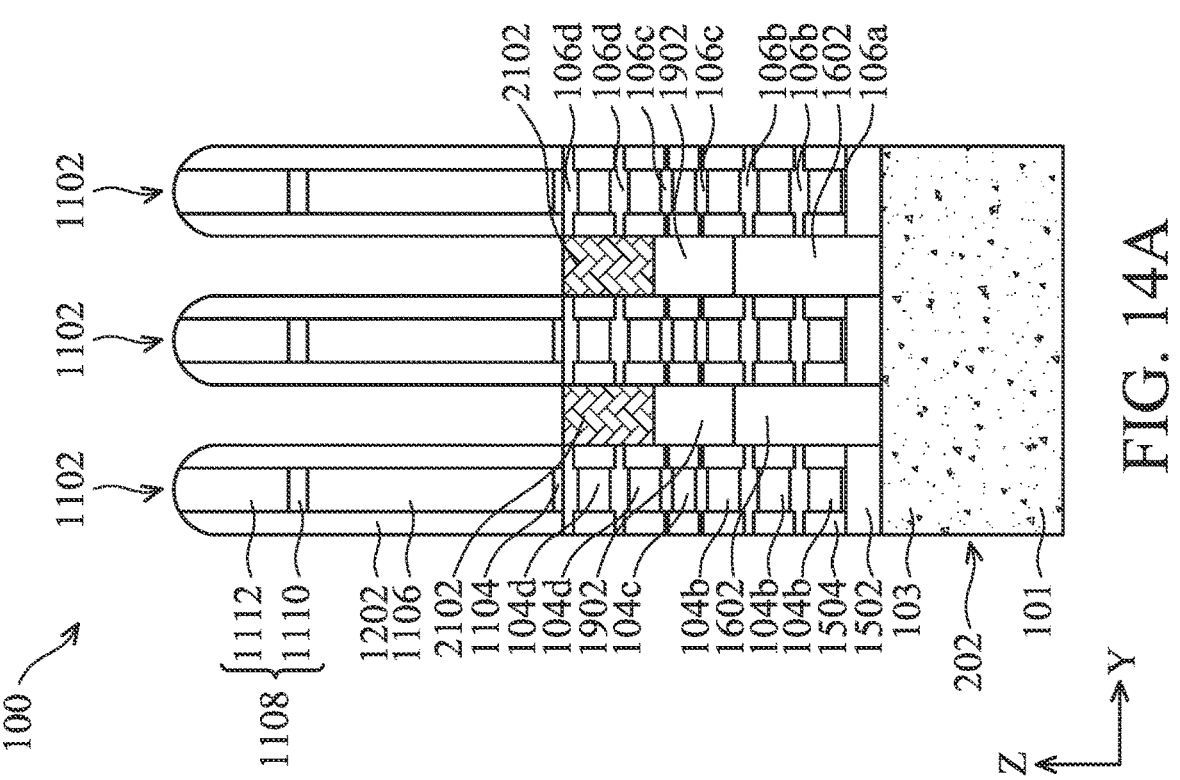

Next, as shown in FIGS. 14A and 14B, the portion of the dielectric material 1902 disposed on the insulating material 402 is removed by any suitable process, such as dry etch or wet etch that selectively removes a portion of the dielectric material 1902 but not the nitrogen-containing material 1112, the spacer 1202, the S/D epitaxial features 2102, and the insulating material 402. After the removal process, side surfaces 1604 of the S/D epitaxial features 1602 are exposed, and side surfaces 1904 of the dielectric material 1902 are formed. The removal of the portion of the dielectric material 1902 may be performed by an isotropic etch process in order to expose the side surfaces 1604 of the S/D epitaxial features 1602. As a result, the side surfaces 1904 of the dielectric material 1902 may have a concave profile, as shown in FIG. 14B.

Figure 15B:
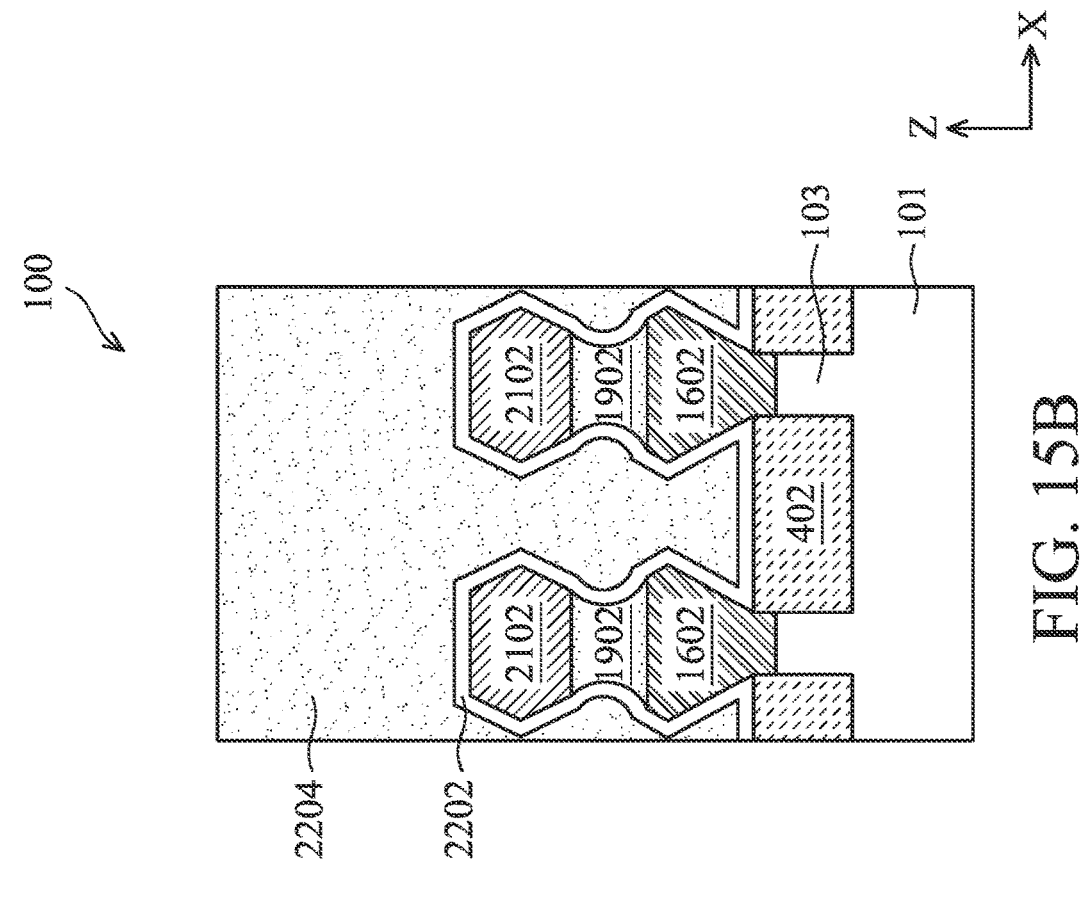
Figure 15A:
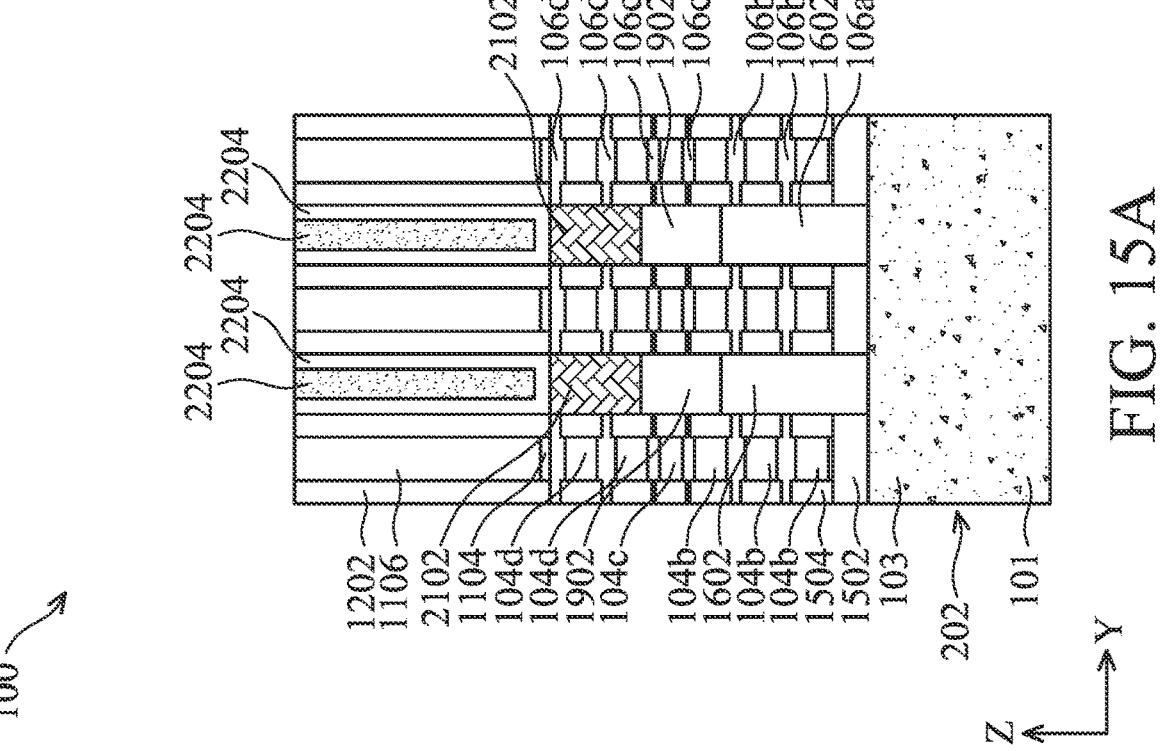

Next, as shown in FIGS. 15A and 15B, a contact etch stop layer (CESL) 2202 may be formed on the S/D epitaxial features 1602, 2102, such as covering the exposed surfaces of the S/D epitaxial features 1602, 2102. The CESL 2202 may be also formed on the insulating material 402. The CESL 2202 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 2202 may be formed by CVD, PECVD, ALD, or any suitable deposition technique. In some embodiments, the CESL 2202 is a conformal layer formed by the ALD process. An interlayer dielectric (ILD) layer 2204 may be formed on the CESL 2202. The materials for the ILD layer 2204 may include an oxide formed from tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 2204 and the etch stop layer 2202 include different materials having different etch selectivity. The ILD layer 2204 may be deposited by a PECVD process or other suitable deposition technique. In some embodiments, after formation of the ILD layer 2204, the semiconductor device structure 100 may be subject to a thermal process to anneal the ILD layer 2204.

A planarization process is performed to expose the sacrificial gate electrode layer 1106. The planarization process may be any suitable process, such as a CMP process. The planarization process removes portions of the ILD layer

2204 and the CESL 2202 disposed on the sacrificial gate stacks 1102. The planarization process may also remove the mask structure 1108.

Figures 16A, 16B:
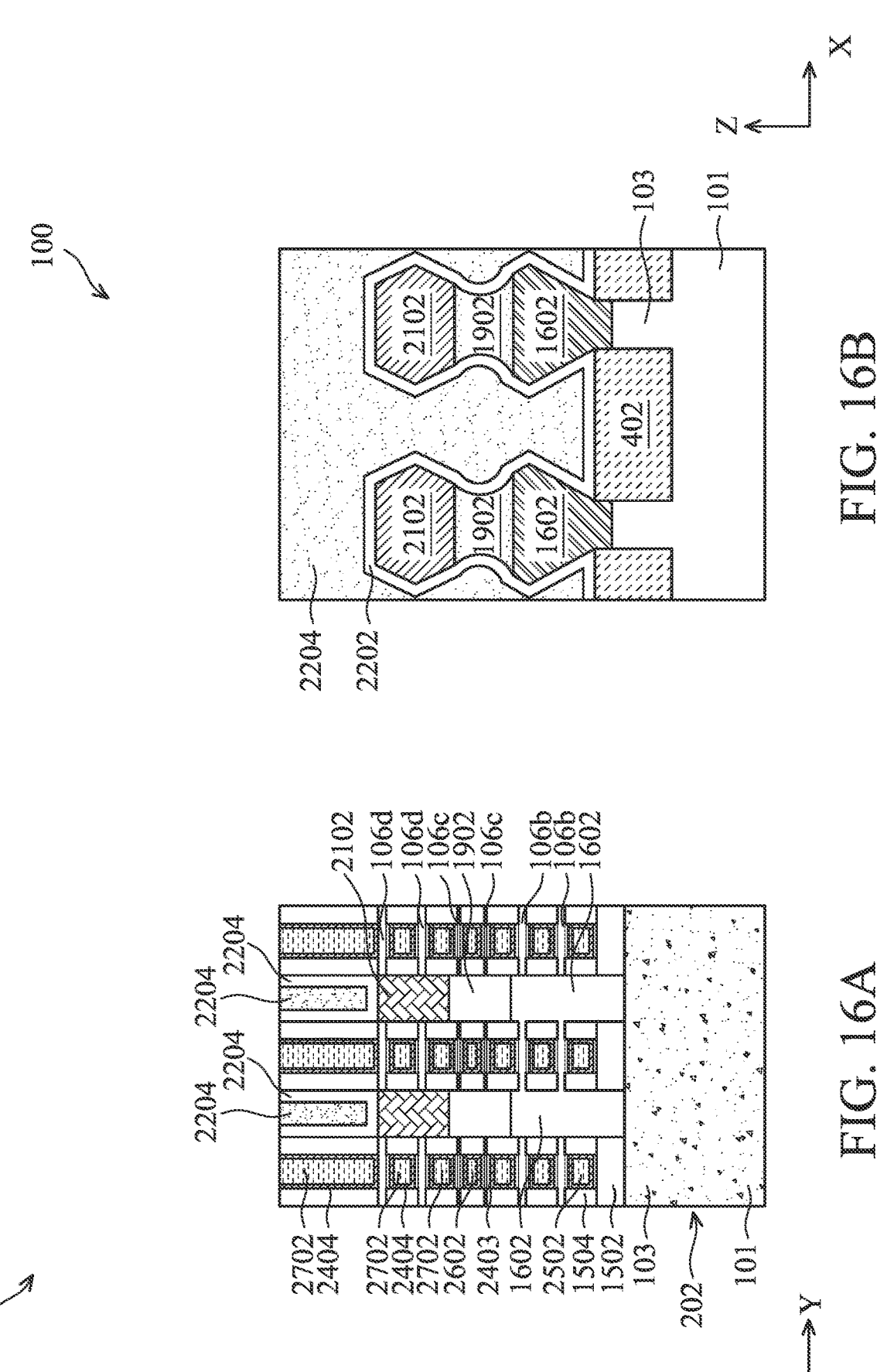

Next, as shown in FIGS. 16A and 16B, the sacrificial gate electrode layer 1106 and the sacrificial gate dielectric layer 1104 are removed, exposing the stacks of first semiconductor layers 104. The sacrificial gate electrode layer 1106 may be first removed by any suitable process, such as dry etch, wet etch, or a combination thereof, followed by the removal of the sacrificial gate dielectric layer 1104, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 1106 but not the spacers 1202, the CESL 2202, and the ILD layer 2204. In some embodiments, the spacers 1202 may be recessed by the etchant used to remove the sacrificial gate electrode layer 1106 and/or the sacrificial gate dielectric layer 1104.

Next, the first semiconductor layers 104 are removed. The removal processes expose the dielectric spacers 1504 and the second semiconductor layers 106. The removal process may be any suitable processes, such as dry etch, wet etch, or a combination thereof. The etch process may be a selective etch process that removes the first semiconductor layers 104 but not the dielectric spacers 1504, the spacers 1202, the CESL 2202, the ILD layer 2204, and the second semiconductor layers 106. As a result, openings are formed between adjacent second semiconductor layers 106 and between the dielectric spacers 1504. The portion of the second semiconductor layers 106 not covered by the dielectric spacers 1504 may be exposed in the openings. Each second semiconductor layer 106*b* may be a nanostructure channel of a first nanostructure transistor, and each second semiconductor layer 106*d* may be a nanostructure channel of a second nanostructure transistor disposed over and aligned with the first nanostructure transistor.

As shown in FIG. 16A, oxygen-containing layers 2403 may be formed around the exposed surfaces of the second semiconductor layers 106 in the openings. Gate dielectric layers 2404 are formed on the oxygen-containing layers 2403, as shown in FIG. 16A. The oxygen-containing layer 2403 may be an oxide layer, and the gate dielectric layer 2404 may include the same material as the sacrificial gate dielectric layer 1104. In some embodiments, the gate dielectric layer 2404 includes a high-k dielectric material. The oxygen-containing layers 2403 and the gate dielectric layers 2404 may be formed by any suitable processes, such as ALD processes. In some embodiments, the oxygen-containing layers 2403 and the gate dielectric layers 2404 are formed by conformal processes.

Next, a first gate electrode layer 2502 is formed in each opening and on the gate dielectric layers 2404. The first gate electrode layer 2502 is formed on the gate dielectric layer 2404 to surround a portion of each second semiconductor layer 106*b*. The first gate electrode layer 2502 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The first gate electrode layers 2502 may be formed by PVD, CVD, ALD, electro-plating, or other suitable method. In some embodiments, the first gate electrode layer 2502 includes a p-type gate electrode layer such as TiN, TaN, TiTaN, TiAlN, WCN, W, Ni, Co, or other suitable material, and the first gate electrode layer 2502 is a gate electrode layer of a PFET. The first gate electrode layer 2502 may be formed by first forming a gate electrode layer filling the opening, followed by an etch back process to recess the gate electrode layer to a level just below the bottom-most second semiconductor layer 106c, as shown in FIG. 16A.

Next, as shown in FIG. 16A, an isolation layer 2602 is formed in each opening 2402 and on the first gate electrode layer 2502. The isolation layer 2602 is formed on the gate dielectric layer 2404 to surround a portion of each second semiconductor layer 106c. The isolation layer 2602 includes one or more layers of dielectric material, such as a metal oxide, for example a refractory metal oxide. The isolation layer 2602 may be formed by PVD, CVD, PECVD, ALD, electro-plating, or other suitable method. The isolation layer 2602 may be formed by first forming a dielectric layer filling the opening 2402, followed by an etch back process to recess the dielectric layer to a level just above the top-most second semiconductor layer 106c, as shown in FIG. 26.

Next, as shown in FIG. 16A, a second gate electrode layer 2702 is formed in each opening and on the isolation layer 2602. The second gate electrode layer 2702 is formed on the gate dielectric layer 2404 to surround a portion of each second semiconductor layer 106d. The second gate electrode layer 2702 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The second gate electrode layers 2702 may be formed by PVD, CVD, ALD, electro-plating, or other suitable method. The first gate electrode layer 2502 and the second gate electrode layer 2702 may include the same material or different materials. In some embodiments, the second gate electrode layer 2702 includes an n-type gate electrode layer such as TiAlC, TaAlC, TiSiAlC, TiC, TaSiAlC, or other suitable material, and the second gate electrode layer 2702 is a gate electrode layer of an NFET.

Figures 17A, 17B:
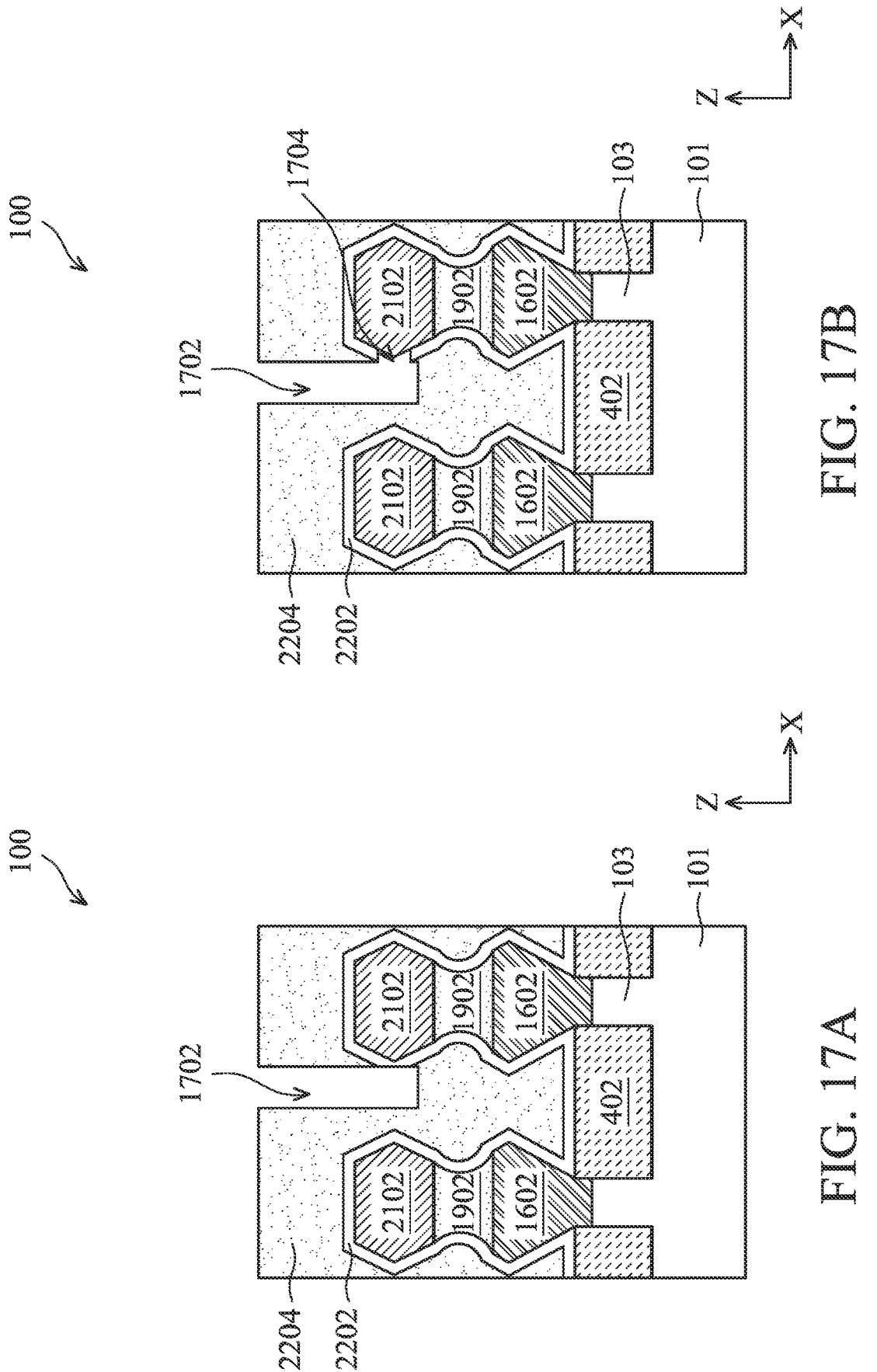
FIGS. 17A-17I are cross-sectional side views of various stages of manufacturing the semiconductor device structure taken along line B-B of FIG. 6, in accordance with some embodiments.

FIGS. 17A-17I are cross-sectional side views of various stages of manufacturing the semiconductor device structure 100 taken along line B-B of FIG. 6, in accordance with some embodiments. As shown in FIG. 17A, an opening 1702 is formed in the ILD layer 2204 between adjacent S/D epitaxial features 2102. The opening 1702 may be a via having a critical dimension ranging from about 1 nm to about 5 nm. Because the opening 1702 is formed between adjacent S/D epitaxial features 2102, if the critical dimension of the opening is greater than about 5 nm, the conductive feature 1706 (FIG. 17C) formed in the opening 1702 may be electrically connected to both of the adjacent S/D epitaxial features 2102. On the other hand, if the critical dimension of the opening is less than about 1 nm, the opening 1702 may be too small for the conductive feature 1706 to be formed therein. The opening 1702 is formed at a location so a portion of the CESL 2202 is exposed in the opening 1702. For example, a portion of the CESL 2202 is a part of the sidewall that defines the opening 1702. The opening 1702 is formed by any suitable process, such as a dry etch, a wet etch, or a combination thereof. In some embodiments, the opening 1702 is formed by a selective dry etch process that removes the portion of the ILD layer 2204 but does not remove the CESL 2202, the spacer 1202, and the second gate electrode layer 2702.

Figures 1, 2, 17C:
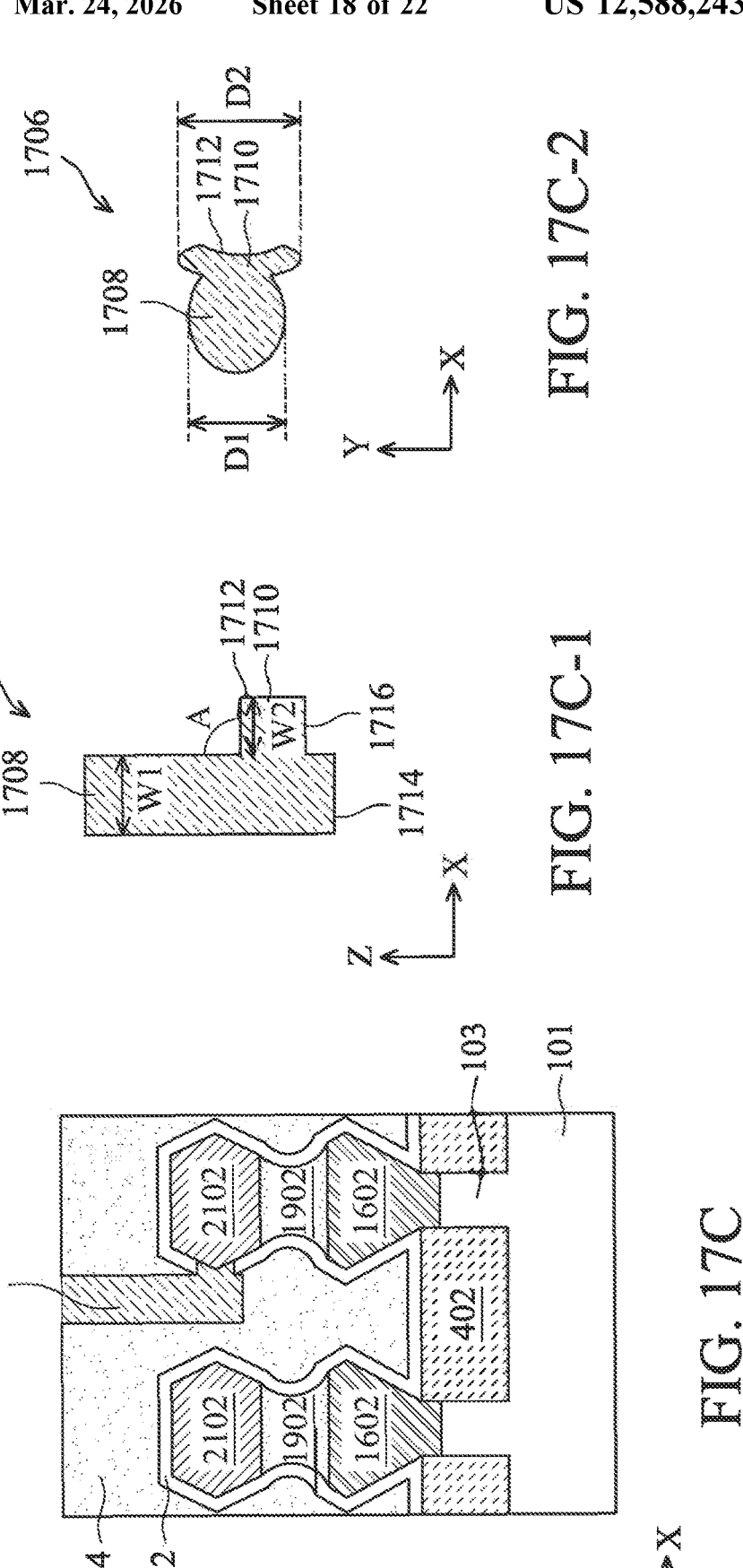

Next, as shown in FIG. 17B, the exposed portion of the CESL 2202 is removed by any suitable process. In some embodiments, the exposed portion of the CESL 2202 is removed by a selective etch process that removes the exposed portion of the CESL 2202 but does not substantially affect the ILD 2204, the spacer 1202, and the second gate electrode layer 2702. An opening 1704 is formed in the CESL 2202, and a portion of the side surface of the S/D epitaxial feature 2102 is exposed in the opening 1704. The openings 1702 and 1704 are connected, as shown in FIG. 17B. Next, as shown in FIG. 17C, the conductive feature 1706 is formed in the openings 1702, 1704. The conductive feature 1706 may include an electrically conductive material having one or more of Ru, Mo, Co, Ni. W, Ti, Ta, Cu, Al, TiN and TaN, and may be formed by any suitable process, such as ALD, PVD, ECP, or CVD. In some embodiments, the conductive feature 1706 is a metal, such as copper. The conductive feature 1706 is electrically connected to the S/D epitaxial feature 2102.

FIG. 17C-1 is an enlarged cross-sectional side view of the conductive feature 1706, in accordance with some embodiments. As shown in FIG. 17C-1, the conductive feature 1706 includes a first portion 1708 and a second portion 1710 extending from the first portion 1708. The first portion 1708 has a first width W1 along the x-axis, and the second portion 1710 has a second width W2 along the x-axis. In some embodiments, the second width W2 is the same as the thickness of the CESL 2202. In some embodiments, the first width W1 is substantially greater than the second width W2 so the openings 1702, 1704 can be filled with the conductive feature 1706 without voids or seams. An angle A is formed between the first portion 1708 and the second portion 1710. The angle A is less than 180 degrees, such as from about 30 degrees to about 120 degrees. The angle A may be determined by the location of the opening 1702 and the process time when removing the exposed CESL 2202 to form the opening 1704. For example, the angle A may be greater than about 90 degrees if the etch process to remove the exposed portion of the CESL 2202 is relatively long, and the angle A may be less than about 90 degrees if the etch process is relatively short. The second portion 1710 includes a surface 1712. In some embodiments, the surface 1712 is in direct contact with a side surface of the S/D epitaxial feature 2102. In some embodiments, a silicide layer (not shown) may be formed between the second portion 1710 and the S/D epitaxial feature 2102, and the surface 1712 is in direct contact with the silicide layer. The first portion 1708 includes a bottom surface 1714, and the second portion 1710 includes a bottom surface 1716. In some embodiments, the bottom surface 1714 is located at a level below the level of the bottom surface 1716. The locations of the bottom surfaces 1714, 1716 may be determined by the depth of the opening 1702. For example, the opening 1702 may be deep so the exposed portion of the CESL 2202 may be a part of the sidewall defining the opening 1702 in order to maximize the exposed portion of the CESL 2202 in the opening 1702. As a result, the bottom surface 1714 is located below the bottom 1716, as shown in FIG. 17C-1. In some embodiments, the exposed portion of the CESL 2202 is a part of the bottom of the opening 1702, and the bottom 1716 may be located below the bottom 1714.

FIG. 17C-2 is a top view of the conductive feature 1706 of FIG. 17C-1, in accordance with some embodiments. As shown in FIG. 17C-2, the first portion 1708 has a first dimension D1 along the y-axis, and the second portion 1710 has a second dimension D2 along the y-axis. The second dimension D2 may be less than, greater than, or equal to the first dimension D1. Similar to the angle A, the second dimension D2 may be determined by the timing of the etch process to remove the exposed portion of the CESL 2202.

For example, the second dimension D2 may be greater than the first dimension D1 if the etch process to remove the exposed portion of the CESL 2202 is relatively long, and the second dimensions D2 may be less than the first dimension D1 if the etch process is relatively short. In some embodiments, in order to increase the contact area of the S/D epitaxial feature 2102, the second dimension D2 is substantially greater than the first dimension D1. As shown in FIG. 17C-2, in some embodiments, the surface 1712 is concave and includes a curvature, which may be the same curvature of the side surface of the S/D epitaxial feature 2102.

FIG. 17C-3 is a cross-sectional side view of the semiconductor device structure 100, in accordance with an alternative embodiment. As shown in FIG. 17C-3, in some embodiments, the conductive feature 1706 is electrically connected to both of the adjacent S/D epitaxial features 2102. The conductive feature 1706 may include the first portion 1708, the second portion 1710 extending from the first portion 1708, and a third portion 1711 extending from the first portion 1708. The third portion 1711 may be extending in opposite direction as the second portion 1710. An angle B is formed between the first portion 1708 and the third portion 1711. The angle B may be the same as the angle A or different from the angle A. The conductive feature 1706 shown in FIG. 17-3 may be formed by forming the opening 1702 (FIG. 17A) to expose both portions of the CESL 2202 disposed on the adjacent S/D epitaxial features 2102. Then the exposed portions of the CESL 2202 are removed to form two opening 1704 (FIG. 17B). The side surfaces of the adjacent S/D epitaxial features 2102 are exposed in the openings 1704, and the conductive feature 1706 formed in the openings 1702, 1704 is electrically connected to both of the adjacent S/D epitaxial features 2102.

Figures 3, 17C, 17D:
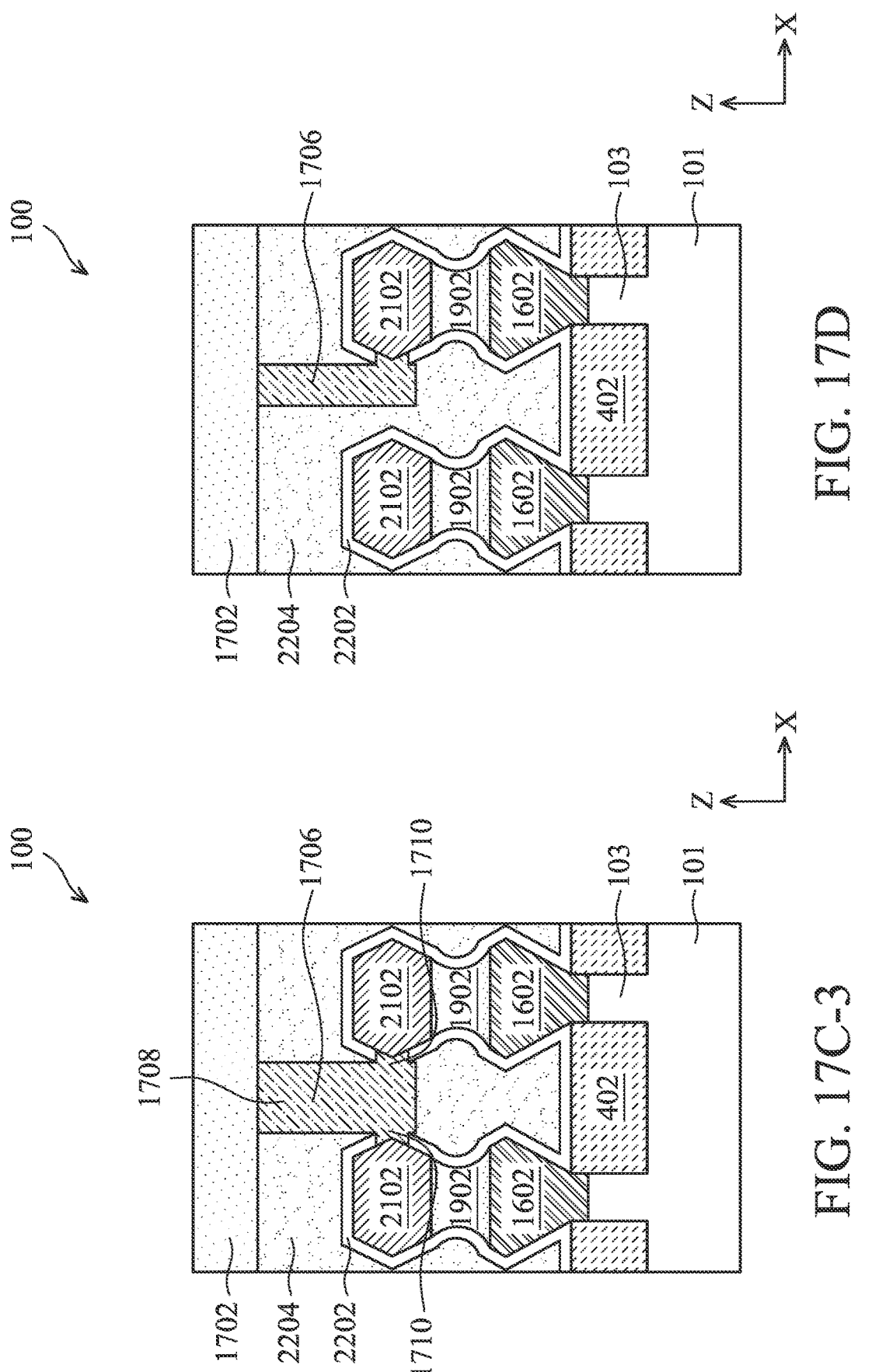

After forming the conductive feature 1706, addition processes may be performed, such as middle of line (MOL) and back end of line (BEOL) processes. For example, conductive features (not shown) for the second gate electrode layer 2702 may be formed, and an interconnect structure 1720 may be formed over the ILD 2204, as shown in FIG. 17D. The interconnect structure 1720 includes a plurality of intermetal dielectric (IMD) layers, and a plurality of conductive features, such as lines and vias, are disposed in the IMD layers. The conductive features disposed in the interconnect structure 1720 provide electrical path to the S/D epitaxial features 2102 via the conductive feature 1706. The conductive feature 1706 is disposed between two adjacent S/D epitaxial features 2102 instead of disposed over the S/D epitaxial feature 2102. As a result, the electrical routing to the S/D epitaxial feature 2102 becomes more flexible.

Figure 17F:
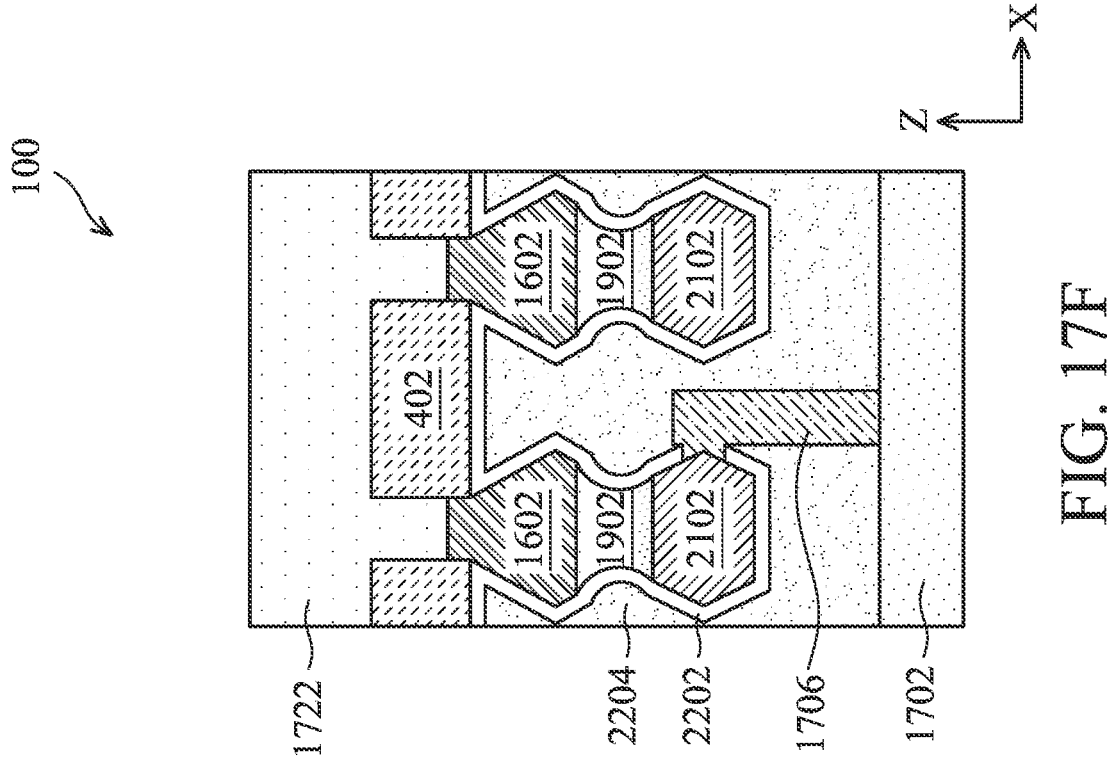
Figure 17E:
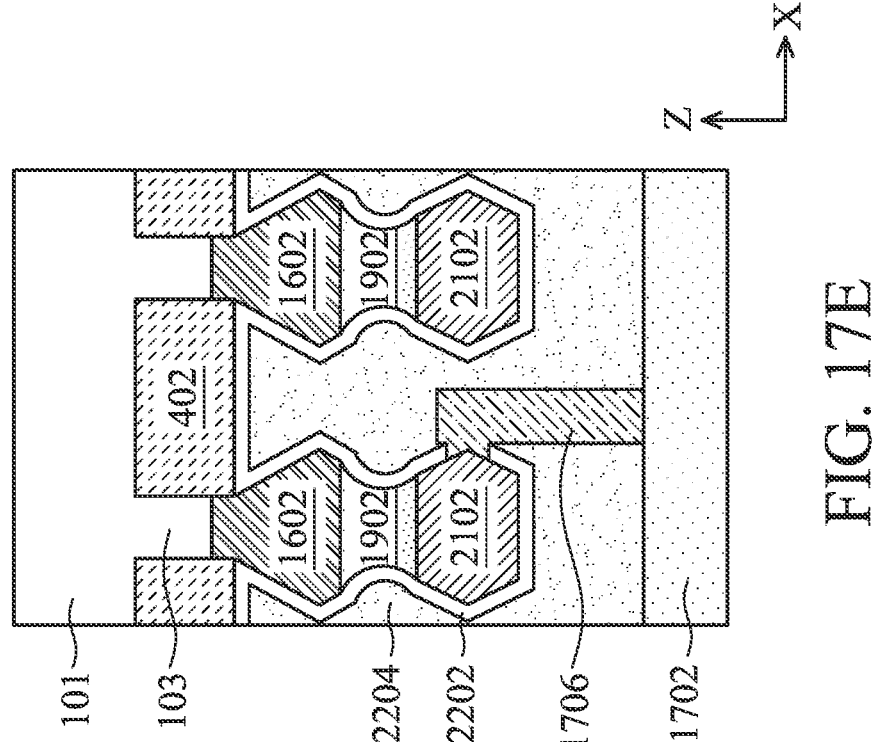
Figure 17H:
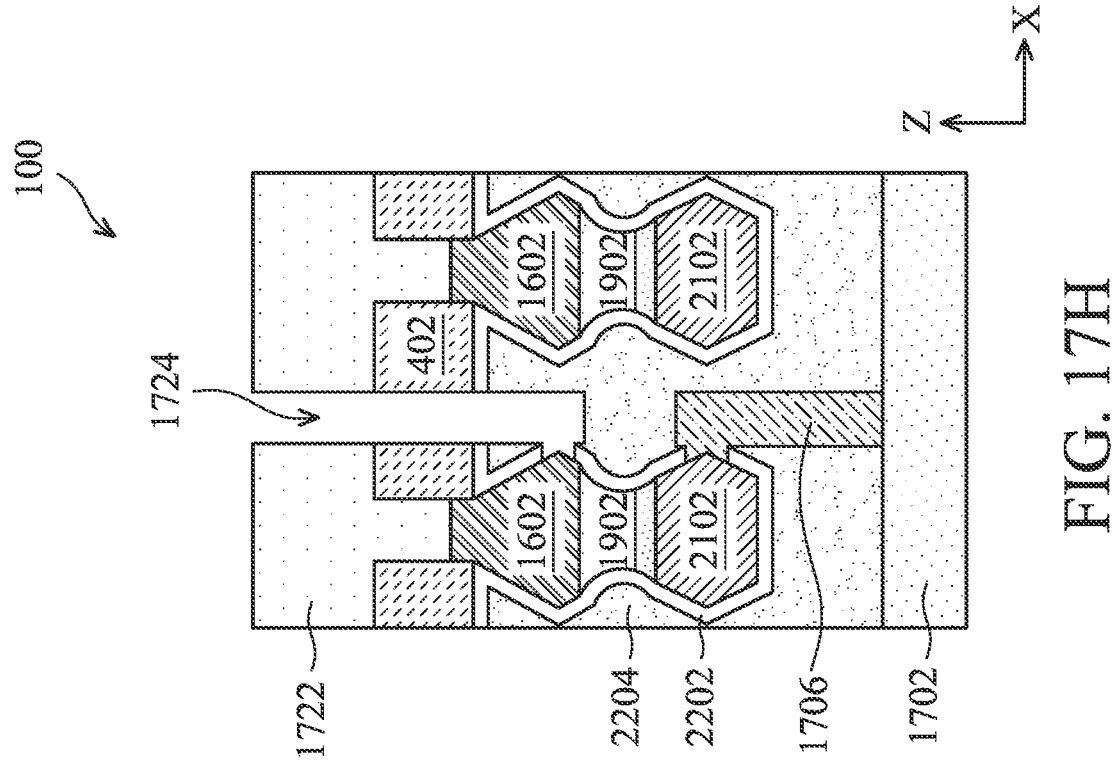
Figure 17G:
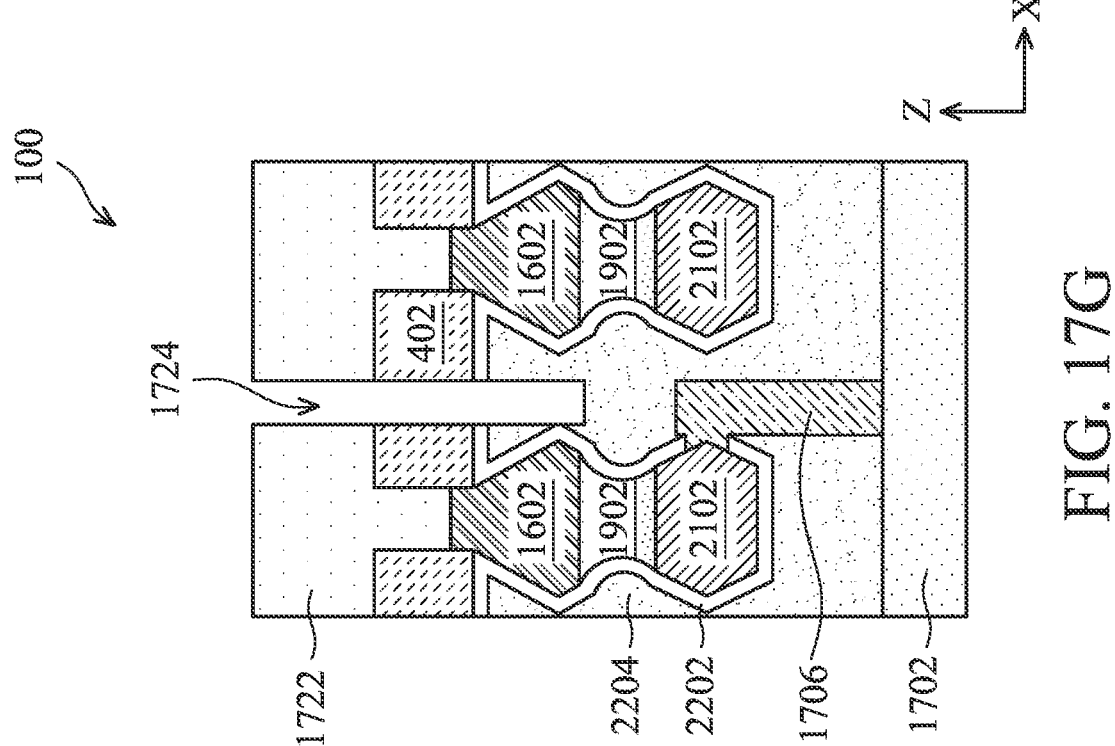

Next, as shown in FIG. 17E, the semiconductor device structure 100 is flipped over for back side processing. The substrate 101 may be removed and replaced with a dielectric material 1722, as shown in FIG. 17F. The substrate 101 may be removed by any suitable method, and the dielectric material 1722 may be formed by any suitable method. In some embodiments, the dielectric material 1722 includes the same material as the insulating material 402. As shown in FIG. 17G, an opening 1724 is formed in the dielectric material 1722, the insulating material 402, and the ILD layer 2204. The opening 1724 may be formed by one or more etch processes. The opening 1724 may have the same critical dimension as the opening 1702. Similar to the opening 1702, a portion of the CESL 2202 disposed on the S/D epitaxial feature 1602 is exposed in the opening 1724. In some embodiments, the exposed portion of the CESL 2202 is a part of the sidewall defining the opening 1724, as shown in FIG. 17G. The exposed portion of the CESL 2202 is removed to form the opening 1726, as shown in FIG. 17H. The S/D epitaxial feature 1602 is exposed in the opening 1726. The opening 1726 may be formed by the same process as the opening 1704.

Figure 17I:
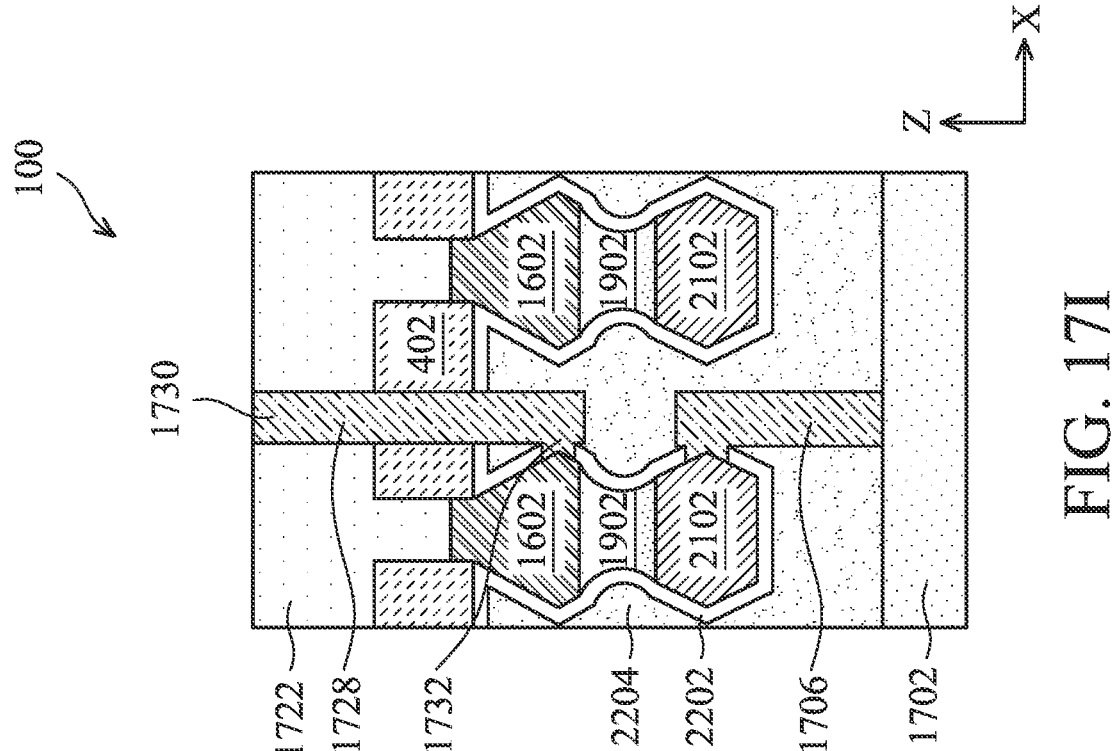

Next, as shown in FIG. 17I, a conductive feature 1728 is formed in the openings 1724, 1726. The conductive feature 1728 may include the same material as the conductive feature 1706 and may be formed by the same process as the conductive feature 1706. Similar to the conductive feature 1706, the conductive feature 1728 includes a first portion 1730 and a second portion 1732 extending from the first portion 1730, and the angle A is formed between the first portion 1730 and the second portion 1732. The second portion 1732 includes a surface in electrical contact with the S/D epitaxial feature 1602. In some embodiments, the conductive feature 1728 may have the same shape as the conductive feature 1706. For example, the conductive feature 1728 may be the conductive feature 1706 shown in FIGS. 17C-1 and 17C-2. In some embodiments, the first portion 1730 of the conductive feature 1728 may have a length along the z-axis that is substantially longer than the length of the first portion 1708 of the conductive feature 1706, because the conductive feature 1728 is formed in the ILD layer 2204, the insulating material 402, and the dielectric material 1722. The conductive feature 1728 may be electrically connected to both of the adjacent S/D epitaxial features 1602 in a similar fashion as the conductive feature 1706 shown in FIG. 17C-3. After the formation of the conductive feature 1728, additional processes may be performed, such as forming a back side power rail to electrically connect to the conductive feature 1728.

The conductive feature 1728 is formed between adjacent S/D epitaxial features 1602, just as the conductive feature 1706 is formed between adjacent S/D epitaxial features 2102. With the conductive features 1706, 1728 formed between S/D epitaxial features, electrical routing to the S/D epitaxial features becomes more flexible. The space over the S/D epitaxial feature 2102 and below the S/D epitaxial feature 1602 may be utilized for other devices, such as conductive features for the gate electrode layers 2702, 2502.

Figure 18:
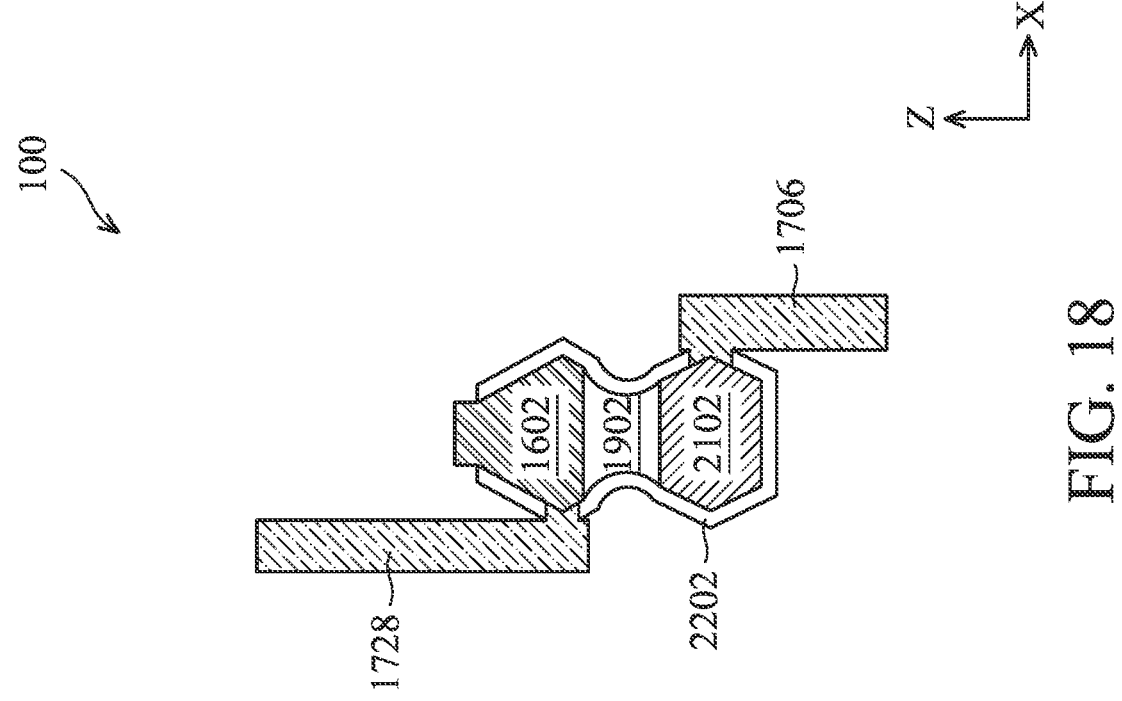
FIG. 18 is a cross-sectional side view of source/drain epitaxial features and conductive features of FIG. 17I, in accordance with alternative embodiments.

FIG. 18 is a cross-sectional side view of source/drain epitaxial features 1602, 2102 and conductive features 1706, 1728 of FIG. 17I, in accordance with alternative embodiments. As shown in FIG. 18, in some embodiments, the conductive features 1728 and 1706 are formed on opposite sides of the S/D epitaxial features 1602, 2102. If the conductive features 1728, 1706 are aligned and formed on the same side as shown in FIG. 17I, there is a risk of over etching the ILD layer 2204. As a result, the conductive feature 1706 may be exposed in the opening 1724 and the conductive feature 1728 may be in contact with the conductive feature 1706. By placing the conductive feature 1728 on the opposite side of the S/D epitaxial feature 1602, the risk of connecting the conductive features 1706, 1728 is reduced.

The present disclosure in various embodiments provide a semiconductor device structure 100 including a conductive feature 1706 disposed between adjacent S/D epitaxial features 2102. The conductive feature 1706 includes a first portion 1708 and a second portion 1710 extending from the first portion 1708. An angle A is formed between the first and second portions 1708, 1710, and the angle A is less than about 180 degrees. Some embodiments may achieve advantages. For example, by placing the conductive feature 1706 between S/D epitaxial features 2102, electrical routing to the S/D epitaxial feature 2102 becomes more flexible.

An embodiment is a semiconductor device structure. The structure includes a first source/drain region, a second source/drain region adjacent the first source/drain region, an interlayer dielectric layer disposed between the first source/drain region and the second source/drain region, and a conductive feature disposed in the interlayer dielectric layer between the first source/drain region and the second source/drain region. The conductive feature includes a first portion and a second portion extending from the first portion, and an angle is formed between the first portion and the second portion. The angle is less than about 180 degrees. The conductive feature is electrically connected to the first source/drain region.

Another embodiment is a semiconductor device structure. The structure includes a first source/drain region, a second source/drain region disposed over the first source/drain region, a first dielectric material disposed between the first source/drain region and the second source/drain region, a third source/drain region adjacent the first source/drain region, a fourth source/drain region disposed over the third source/drain region, a second dielectric material disposed between the third source/drain region and the fourth source/drain region, and a first conductive feature disposed between the first and third source/drain regions. The first conductive feature is electrically connected to the first source/drain region. The structure further includes a second conductive feature disposed between the second and fourth source/drain regions, and the second conductive feature is electrically connected to the second source/drain region.

A further embodiment is a method. The method includes forming a stack of semiconductor layers over a substrate, forming a first source/drain region in contact with a first one or more semiconductor layers of the stack of semiconductor layers, forming a first dielectric material on and in contact with the first source/drain region, recessing the first dielectric material, forming a second source/drain region on and in contact with the first dielectric material, recessing the first dielectric material, forming a contact etch stop layer on the first source/drain region, the second source/drain region, and the first dielectric material, forming an interlayer dielectric layer on the contact etch stop layer, and forming a first opening in the interlayer dielectric layer. A portion of the contact etch stop layer is exposed and is a part of a sidewall defining the first opening. The method further includes removing the exposed portion of the contact etch stop layer to form a second opening, and a portion of a side surface of the second source/drain region is exposed in the second opening. The method further includes forming a first conductive feature in the first and second openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a stack of semiconductor layers over a substrate;

forming a first source/drain region in contact with a first one or more semiconductor layers of the stack of semiconductor layers;

forming a first dielectric material on and in contact with the first source/drain region;

recessing the first dielectric material;

forming a second source/drain region on and in contact with the first dielectric material;

recessing the first dielectric material;

forming a contact etch stop layer on the first source/drain region, the second source/drain region, and the first dielectric material;

forming an interlayer dielectric layer on the contact etch stop layer;

forming a first opening in the interlayer dielectric layer, wherein a portion of the contact etch stop layer is exposed and is a part of a sidewall defining the first opening;

removing the exposed portion of the contact etch stop layer to form a second opening, wherein a portion of a side surface of the second source/drain region is exposed in the second opening; and forming a first conductive feature in the first and second openings.

2. The method of claim 1, further comprising forming an interconnect structure over the interlayer dielectric layer.

3. The method of claim 2, further comprising:

removing the substrate;

forming a second dielectric material below the first source/drain region, wherein the second dielectric material is below an insulating material, and the interlayer dielectric layer is disposed on the insulating material.

4. The method of claim 3, further comprising:

forming a third opening in the second dielectric material, the insulating material, and the interlayer dielectric layer, wherein a portion of the contact etch stop layer is exposed and is a part of a sidewall defining the third opening;

removing the exposed portion of the contact etch stop layer to form a fourth opening, wherein a portion of a side surface of the first source/drain region is exposed in the fourth opening; and forming a second conductive feature in the third and fourth openings.

5. A method, comprising:

forming a first source/drain region over a substrate;

forming a contact etch stop layer around the first source/drain region;

forming an interlayer dielectric layer on the contact etch stop layer;

forming a first opening in the interlayer dielectric layer, wherein a first portion of the contact etch stop layer is exposed and is a part of a sidewall defining the first opening;

removing the exposed first portion of the contact etch stop layer to form a second opening, wherein a portion of a side surface of the first source/drain region is exposed in the second opening; and forming a first conductive feature in the first and second openings.

6. The Method of claim 5, wherein the interlayer dielectric layer is formed over the first source/drain region.

7. The method of claim 6, wherein the first opening is formed adjacent the first source/drain region.

8. The method of claim 5, further comprising forming a second source/drain region over the substrate, wherein the first source/drain region is formed over the second source/drain region.

9. The method of claim 8, further comprising depositing a dielectric material around the second source/drain region, wherein the first source/drain region is formed over the dielectric material.

10. The method of claim 9, further comprising removing portions of the dielectric material to expose side surfaces of the second source/drain region.

11. The method of claim 10, wherein the portions of the dielectric material are removed by an isotropic etch process.

12. The method of claim 10, wherein the contact etch stop layer is formed on the exposed side surfaces of the second source/drain region.

13. The method of claim 12, further comprising forming a third opening in the interlayer dielectric layer to expose a second portion of the contact etch stop layer, wherein the exposed second portion of the contact etch stop layer is a part of a sidewall defining the third opening.

14. The method of claim 13, further comprising removing the exposed second portion of the contact etch stop layer to form a fourth opening, wherein a portion of the side surface of the second source/drain region is exposed in the fourth opening.

15. The method of claim 14, further comprising forming a second conductive feature in the third and fourth openings.

16. A method, comprising:

forming a first source/drain region over a substrate;

forming a dielectric material over the first source/drain region;

forming a second source/drain region over the dielectric material;

removing portions of the dielectric material, wherein a side surface of a remaining portion of the dielectric material has a concave profile;

forming a contact etch stop layer around the first source/drain region and the second source/drain region;

forming an interlayer dielectric layer on the contact etch stop layer;

forming an opening in the interlayer dielectric layer and the contact etch stop layer, wherein a portion of a side surface of the second source/drain region is exposed; and forming a conductive feature in the opening.

17. The method of claim 16, further comprising forming a third source/drain region adjacent the first source/drain region.

18. The method of claim 17, further comprising forming a fourth source/drain region over the third source/drain region, wherein the fourth source/drain region is adjacent the second source/drain region.

19. The method of claim 18, wherein a portion of a side surface of the fourth source/drain region is exposed in the opening.

20. The method of claim 19, wherein the conductive feature is interfacing the exposed portion of the side surface of the fourth source/drain region.

\* \* \* \* \*